(12) United States Patent
Mok et al.

(10) Patent No.: US 7,002,247 B2
(45) Date of Patent: Feb. 21, 2006

(54) THERMAL INTERPOSER FOR THERMAL MANAGEMENT OF SEMICONDUCTOR DEVICES

(75) Inventors: Lawrence S. Mok, Brewster, NY (US); Evan G. Colgan, Chestnut Ridge, NY (US); Minhua Lu, Mohegan Lake, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 10/874,297

(22) Filed: Jun. 18, 2004

(65) Prior Publication Data

US 2005/0280162 A1    Dec. 22, 2005

(51) Int. Cl.
*H01I 23/34* (2006.01)

(52) U.S. Cl. .................. 257/713; 257/625; 257/658; 257/675; 257/705; 257/706; 257/712; 257/720; 257/773; 257/798; 257/717

(58) Field of Classification Search ........ 257/705–706, 257/712–713, 717, 720, 773, 625, 658, 675, 257/798
See application file for complete search history.

(56) References Cited

U.S. PATENT DOCUMENTS

| | | | |
|---|---|---|---|
| 3,984,861 A | 10/1976 | Kessler, Jr. ............... 257/715 |
| 4,327,399 A | 4/1982 | Sasaki et al. ............... 361/698 |
| 5,769,154 A | 6/1998 | Adkins et al. ......... 165/104.26 |
| 5,947,193 A | 9/1999 | Adkins et al. ......... 165/104.26 |
| 6,056,044 A | 5/2000 | Benson et al. ......... 165/104.26 |
| 6,162,659 A | 12/2000 | Wu ........................... 438/106 |
| 6,351,384 B1 * | 2/2002 | Daikoku et al. ............ 361/704 |
| 6,566,743 B1 | 5/2003 | Zuo ........................... 257/678 |
| 6,945,317 B1 * | 9/2005 | Garner et al. .......... 165/104.26 |
| 2002/0045297 A1 * | 4/2002 | Leedy ........................ 438/149 |
| 2002/0135980 A1 | 9/2002 | Vafai .......................... 361/700 |
| 2003/0171006 A1 * | 9/2003 | Gektin et al. ............... 438/795 |

* cited by examiner

*Primary Examiner*—Amir Zarabian
*Assistant Examiner*—Ida M. Soward
(74) *Attorney, Agent, or Firm*—Stephen Bongini; Fleit, Kain, Gibbons, Gutman, Bongini & Bianco P.L.

(57) ABSTRACT

A thermal interposer is provided for attachment to the back surface of a semiconductor device so as to give a very low thermal resistance. In one preferred embodiment, the thermal interposer has two plates containing wick structures such as grooves. The thermal interposer is integrated with a semiconductor device so as to form a vapor chamber. In particular, the back surface of the semiconductor chip is in direct contact with the interior sealed volume of the vapor chamber, so as to greatly reduce the thermal resistance from the combination of the chip and the vapor chamber. Further, the upper plate is thermally coupled to a heat-sinking fixture such as a heat sink or a cold plate.

30 Claims, 16 Drawing Sheets

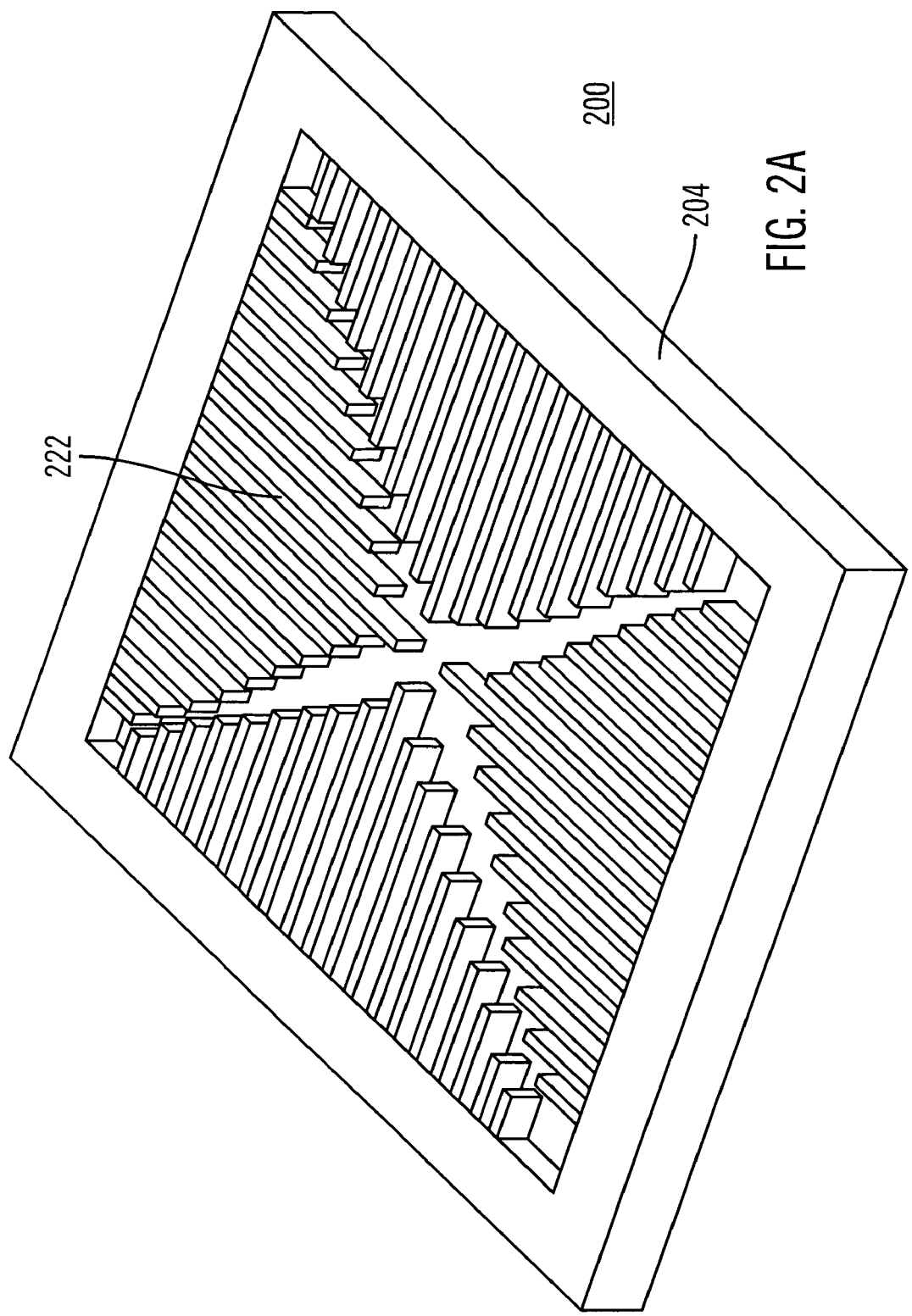

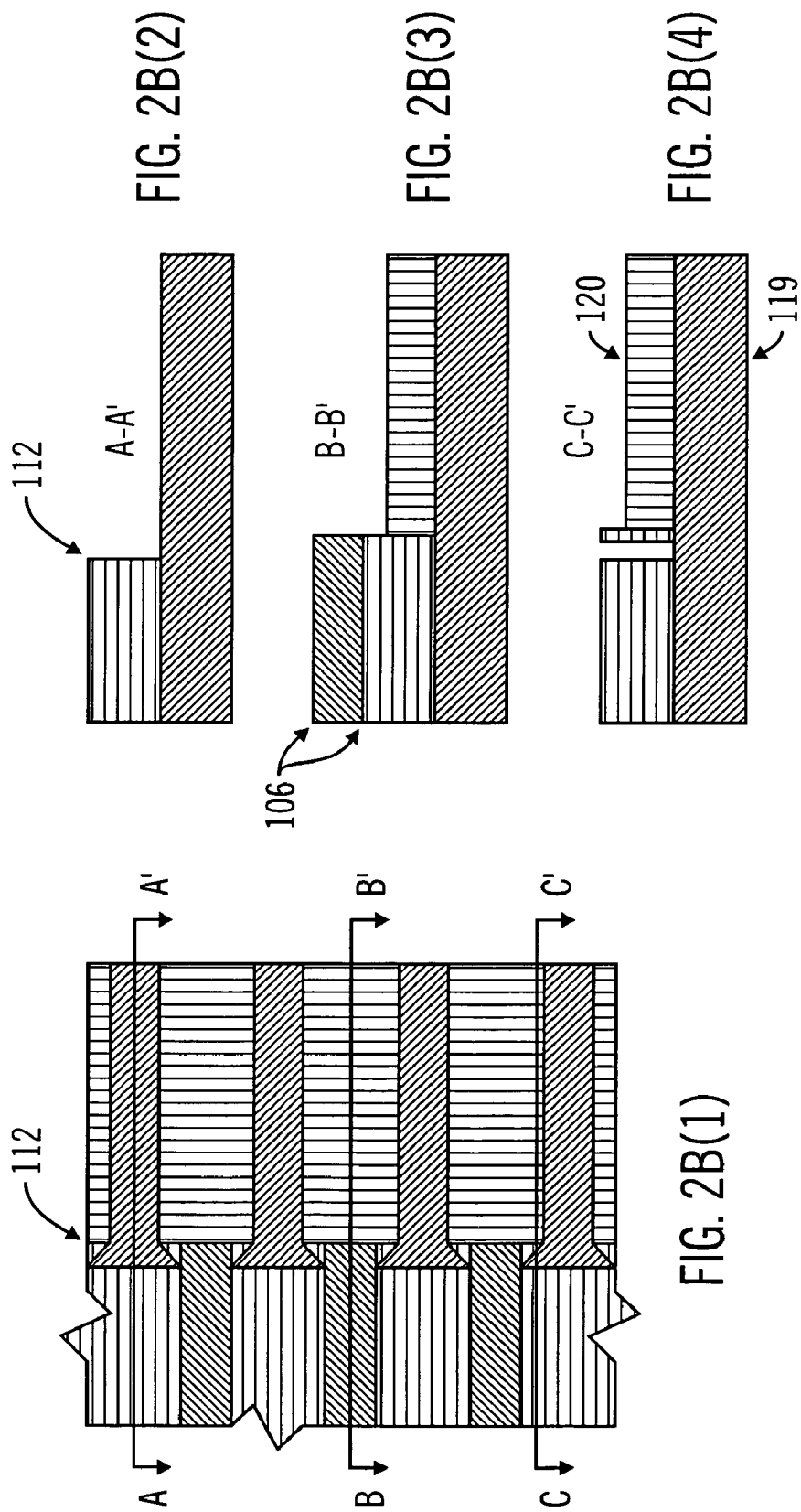

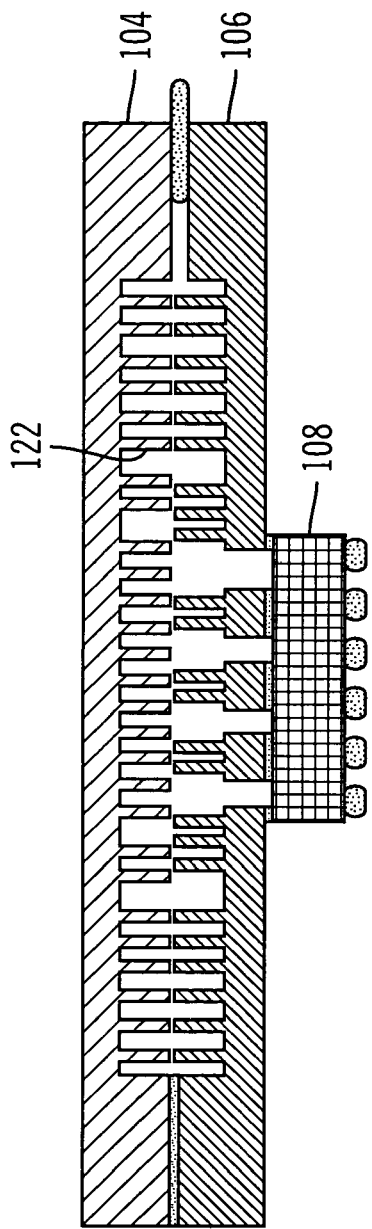
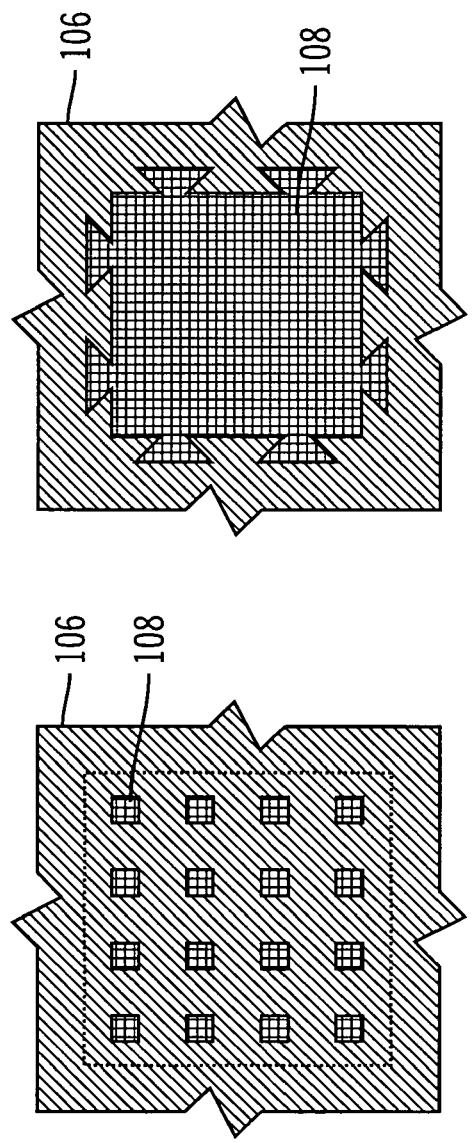
FIG. 2C(1)
FIG. 2C(2)
FIG. 2C(3)

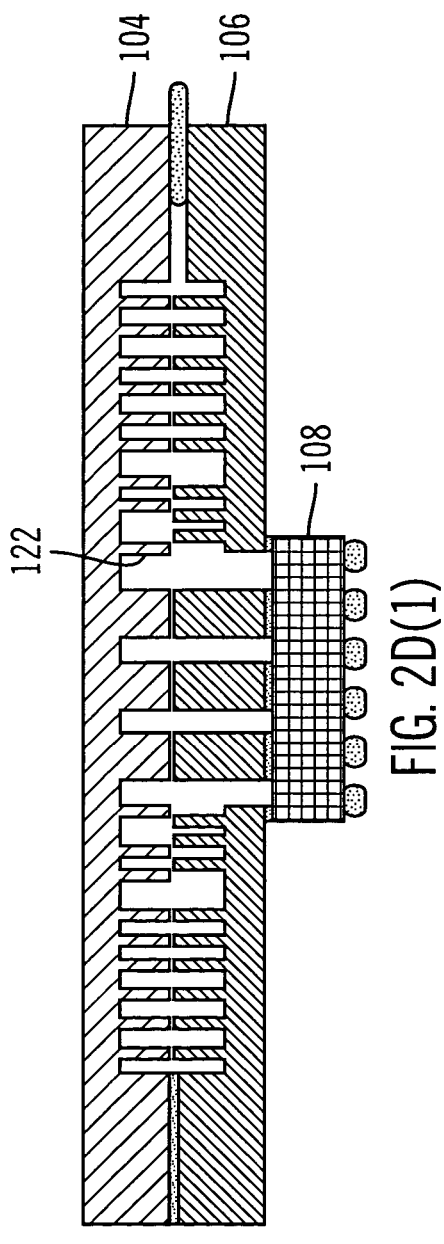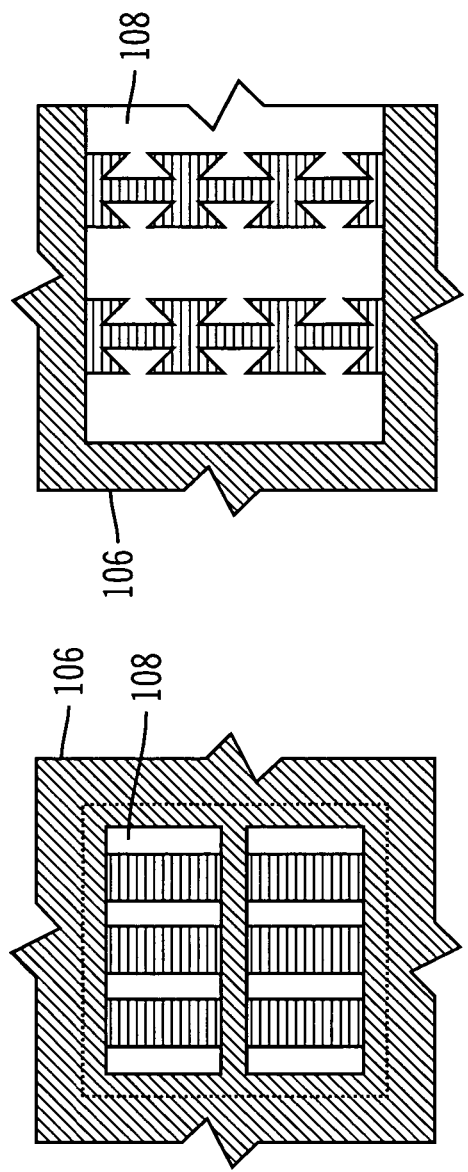
FIG. 2D(1)
FIG. 2D(2)
FIG. 2D(3)

THERMAL INTERPOSER FOR THERMAL MANAGEMENT OF SEMICONDUCTOR DEVICES

CROSS-REFERENCE TO RELATED APPLICATIONS

This application is related to the inventors' application "THERMAL INTERPOSER FOR THERMAL MANAGEMENT OF SEMICONDUCTOR DEVICES," Ser. No. 10/872,575, which was filed on the same day as the present application and commonly assigned herewith to International Business Machines Corporation. This related application is incorporated herein by reference.

BACKGROUND OF THE INVENTION

1. Field of the Invention

This invention generally relates to the field of electronic devices, and more specifically to thermal interposers, or heat spreaders, for thermal management and cooling of semiconductor devices.

2. Description of Related Art

Thermal management is of great importance to the operation of electronic devices. Thermal management is especially important in the operation of semiconductor devices as factors such as increasing operating frequencies push power consumption, and therefore heat generation, to the limits of the cooling capacity of traditional passive, air-cooled, heat sink technology. The power density ($W/cm^2$) in semiconductor devices continues to increase as the circuit density and operating frequency increase. Thermal management includes device and allowing the generated heat to disperse to its surroundings, while maintaining the semiconductor device at as low a temperature as possible. Insufficient transfer of heat away from an electronic device can result in performance and reliability degradation of that device or circuit due to an unacceptably high operating temperature.

Typical thermal management solutions use some combination of aluminum or copper heat sinks, fans, thermal spreaders/heat pipes, and thermal pastes or adhesives (Thermal Interface Materials or "TIMS") to form a low thermal resistance path between the semiconductor chip and the ambient. Typically, high performance semiconductor chips have one or more "hot-spots", which are regions of the chip having a power density that is substantially greater than the average power density (e.g., two to three times the average power density). To insure reliable long term operation, the requirements for the thermal management solution must be driven by these hot spots, not just by the average power density of the chip.

One conventional technique for providing improved thermal management is the use of micro-channels. The structure utilizes a set of narrow channels that may be introduced into the integrated circuit chip itself or into a cooling member that is in intimate contact with the chip. In either case, the channels have heights and widths on the order of several tens of microns and are encapsulated by either the chip or the cooling member in intimate contact with the chip. This results in an array of micron-sized rectangular tubes through which a cooling liquid is forced so as to provide for dissipating the heat generated within the integrated circuit chip.

Another conventional technique for providing improved thermal management is the use of a vapor chamber as a heat spreader. A vapor chamber transports heat within a system with a low thermal resistance. FIG. 9 illustrates a cross sectional diagram of a conventional thermal management structure that includes a vapor chamber. As shown, the front surface of the semiconductor chip 12 is electrically connected to an organic package 14 using micro solder balls 16 (e.g., C4's). The chip 12 is sometimes underfilled with a polymer (not shown) for improved reliability. The packaged chip is then mounted onto a printed circuit board 18 using larger solder balls 20 (e.g., a BGA or ball grid array). The primary thermal path for the chip 12 is from the back surface of the chip, through a layer 21 of a first thermal interface material (TIM), which is typically a compliant grease or paste that is filled with particles of a thermally conductive material (though a thermally conductive compliant adhesive such as an Ag filled silicone can also be used), through a vapor chamber thermal spreader 22, and then through a second TIM layer 23 to an air cooler heat sink 24.

In order to achieve an acceptable operating temperature for the chip, it is necessary to minimize the total thermal resistance (° C/W) from the chip to the ambient. The TIM layers provide mechanical compliance to relieve the thermal expansion mismatch stress between the components that are constructed of different materials, but they also represent a significant portion of the total thermal resistance. The vapor chamber 22 laterally spreads the heat so as to reduce the power density ($W/cm^2$) to reduce the total temperature drop. Because they can be fabricated from similar materials, the vapor chamber heat spreader 22 can be integrated with the heat sink 24 into one unit.

The vapor chamber 22 is a vacuum vessel having a wick (or groove) structure lining its inside walls. The wick structure is saturated with a working liquid. As heat is applied during operation, the fluid at that location in the wick structure is vaporized and the vapor rushes to fill the vacuum. Wherever this vapor comes into contact with a cooler wall surface, it condenses and releases its latent heat of vaporization. The condensed fluid returns to the heat source via capillary action, and is then ready to be vaporized again to repeat the cycle.

For example, in the conventional structure of FIG. 9, vaporization primarily occurs in the region of the bottom surface of the vapor chamber that is above the chip and condensation primarily occurs on the top surface of the vapor chamber that is attached to the heat sink. The condensed working fluid is transported to the perimeter of the vapor chamber and then is transported from the wick structure on the top inner surface, down the side walls, and to the wick structure on the bottom inner surface. The capillary action of the wick that lines the inside walls enables the vapor chamber to work in any orientation with respect to gravity. However, such a conventional vapor chamber is typically fabricated out of metal. Thus, it cannot be rigidly joined to the integrated circuit chip due to a thermal expansion mismatch.

Yet another conventional technique for providing improved thermal management is the use of heat pipes. A heat pipe operates similarly to a vapor chamber, but a heat pipe is designed to transport heat from the heat source to a remote heat sink. A heat pipe is typically used when there is not sufficient space available directly over a chip to mount a heat sink so that the heat sink must be mounted at a remote location. A typical heat pipe for semiconductor devices is a circular metal tube with a wick structure on the inside. A portion of the heat pipe is filled with a working fluid and the pipe is sealed. The heat pipe transfers energy through the evaporation and condensation of the fluid. More specifically, as heat is applied to the evaporator region of the heat pipe, the fluid in the channel vaporizes, and thus removes the heat. The vapor travels through the channel to the condenser region of the structure, where the heat sink is attached to the heat pipe and the heat is released during condensation. The working fluid is then transported back to the evaporator region along the wick structure in the pipe by the capillary effect. As with a conventional vapor chamber structure, because the heat pipe is fabricated from a metal (such as copper), it cannot be rigidly joined to an integrated circuit chip due to a thermal expansion mismatch. Instead, a TIM layer is needed to provide mechanical compliance. However, as explained above, a TIM layer has a larger thermal resistance than is desired.

There have been a number of efforts to provide improved vapor chamber heat sinks. For example, in U.S. Pat. No. 4,327,399, Sasaki et al. describe a heat pipe structure that includes a wiring substrate of ceramic or silicon having a cavity in the interior. On the inner surface of the cavity there is formed a wick. Radiating fins are formed at the end of the substrate and chips are securely inserted in holes that communicate with the cavity so that the wick on their upper surfaces is aligned with the wick on the inner surface of the cavity for directly cooling the integrated circuit elements. However, this structure is very complicated and presents practical disadvantages such as difficulty in electrically connecting and reworking the chips.

Others efforts have proposed forming a vapor chamber heat spreader from silicon so that it can be directly joined to the back of a chip. Such silicon vapor chambers have been described by D. S. Shen et al. in "Micro Heat Spreader Enhanced Heat Transfer in MCMs" (Proceedings of the 1995 IEEE Multi-Chip Module Conference, MCMC '95, Santa Cruz, pp. 189–194), D. A. Benson et al. in "Micro-Machined Heat Pipes in Silicon MCM Substrates" (Proceedings of the 1996 IEEE Multi-Chip Module Conference, MCMC '96, Santa Cruz, pp. 127–129), C. Gillot et al. in "Silicon Heat Pipes used as Thermal Spreaders" (Proceedings of the 2002 IEEE Inter Society Conference on Thermal Phenomena, pp. 1052–1057), and C. Gillot et al. in "Silicon Heat Pipes used as Thermal Spreaders" (IEEE Transactions on Components and Packaging Technologies, Vol. 26, No. 2, pp. 332–339).

Shen et al. and Benson et al., and U.S. Pat. Nos. 5,769,154 and 6,056,044 describe wick structures formed in silicon along with heat pipes formed by bonding a silicon substrate containing a wick structure to a cap containing vapor channels. However, a disadvantage of such a structure is that the wick is only provided on one surface of the interior cavity of the vapor chamber. The publications by Gillot et al. describe silicon heat pipes that are formed by bonding together a stack of three wafers, with large portions of the middle wafer being removed to form vapor passage cavities. Fine channels are formed on the inside surfaces of the top and bottom silicon wafers as wick structures. However, such a structure is complicated and its performance is limited because the fluid return is only around the perimeter region. Additionally, the use of secondary wick structure for conventional metallic heat pipes has been proposed by J. Zuo in U.S. Patent Application Publication No. 2002/0139516 A1. However, such a structure would be difficult to implement using either of the silicon vapor chamber structures described above. Further, metallic vapor chambers present the disadvantages described above.

Therefore, a need exists to overcome the problems with conventional thermal management techniques as discussed above, and particularly for an improved vapor chamber heat spreader that can be attached to the back surface of a semiconductor device so as to give a very low thermal resistance, especially for areas of the semiconductor device that contain local hot spots.

SUMMARY OF THE INVENTION

Briefly, in accordance with the present invention, disclosed are thermal interposers for providing thermal management of a semiconductor device.

One embodiment of the present invention provides an integrated circuit device that includes a semiconductor device having a front surface containing active devices and a back surface that does not contain active devices, an upper plate having a bottom surface with a plurality of grooves and a top surface, and a lower plate having a top surface with a plurality of grooves and a bottom surface. The semiconductor device is made of a material having a coefficient of thermal expansion, the upper plate is made of a material having high thermal conductivity, and the lower plate is made of a material having a coefficient of thermal expansion that is substantially the same as the coefficient of thermal expansion of the material of which the semiconductor device is made. The bottom surface of the upper plate is hermetically bonded to the top surface of the lower plate, and one opening extends through the lower plate. The back surface of the semiconductor device is hermetically bonded to the bottom surface of the lower plate so as to completely cover the opening in the lower plate, so that a vapor chamber is formed by the semiconductor device and the upper and lower plates.

Another embodiment of the present invention provides an integrated circuit device that includes a semiconductor device having a front surface containing active devices and a back surface that does not contain active devices, an upper plate having a bottom surface with a plurality of grooves and a top surface, and a lower plate having a top surface with a plurality of grooves and a bottom surface. The semiconductor device is made of a material having a coefficient of thermal expansion, the upper plate is made of a material having high thermal conductivity, and the lower plate is made of a material having a coefficient of thermal expansion that is substantially the same as the coefficient of thermal expansion of the material of which the semiconductor device is made. The bottom surface of the upper plate is hermetically bonded to the top surface of the lower plate, and multiple openings arranged in an array extend through the lower plate. The back surface of the semiconductor device is hermetically bonded to the bottom surface of the lower plate so as to completely cover all of the openings in the lower plate, so that a vapor chamber is formed by the semiconductor device and the upper and lower plates.

Yet another embodiment of the present invention provides an integrated circuit device that includes a semiconductor device having a front surface containing active devices and a back surface that does not contain active devices, and a plate having a bottom surface with a plurality of grooves. The semiconductor device is made of a material having a coefficient of thermal expansion, and the plate is made of a material having high thermal conductivity and a coefficient of thermal expansion that is substantially the same as the coefficient of thermal expansion of the material of which the semiconductor device is made. The back surface of the semiconductor device is hermetically bonded to the bottom surface of the plate so as to completely cover the grooves, so that a vapor chamber is formed by the semiconductor device and the plate. The grooves on the bottom surface of the plate comprise a plurality of walls that extend to within less than 250 microns from the back surface of the semiconductor device.

A further embodiment of the present invention provides an integrated circuit device that includes a semiconductor device having a front surface containing active devices and a back surface that does not contain active devices, an upper plate having a bottom surface with a recess, and a lower plate having a top surface with a recess and a bottom surface. The semiconductor device is made of a material having a coefficient of thermal expansion, the upper plate is made of a material having high thermal conductivity, and the lower plate is made of a material having a coefficient of thermal expansion that is substantially the same as the coefficient of thermal expansion of the material of which the semiconductor device is made. The bottom surface of the upper plate is hermetically bonded to the top surface of the lower plate, and at least one opening extends through the lower plate within the recess in the lower plate. The back surface of the semiconductor device is hermetically bonded to the bottom surface of the lower plate so as to completely cover the at least one opening in the lower plate, so that a vapor chamber is formed by the semiconductor device and the upper and lower plates. At least a top surface of the recess in the upper plate and at least a bottom surface of the recess in the lower plate are lined with graphite foam, and a plurality of graphite foam pillars extend from the graphite foam lining the top surface of the recess in the upper plate to the back surface of the semiconductor device, to act as a vertical wick structure for transporting condensed working fluid directly to the back surface of the semiconductor device.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 2A illustrates a simplified perspective diagram of the upper plate of the thermal interposer of FIG. 1.

FIGS. 2B(1) through 2B(4) illustrate diagrams of an exemplary vertical wick structure for the thermal interposer of FIG.

FIGS. 2C(1) through 2C(3) illustrate cross sectional diagrams of an integrated thermal interposer according to an embodiment of the present invention.

FIGS. 2D(1) through 2D(3) illustrate cross sectional diagrams of an integrated thermal interposer according to another embodiment of the present invention.

DETAILED DESCRIPTION OF PREFERRED EMBODIMENTS

Figure 1:
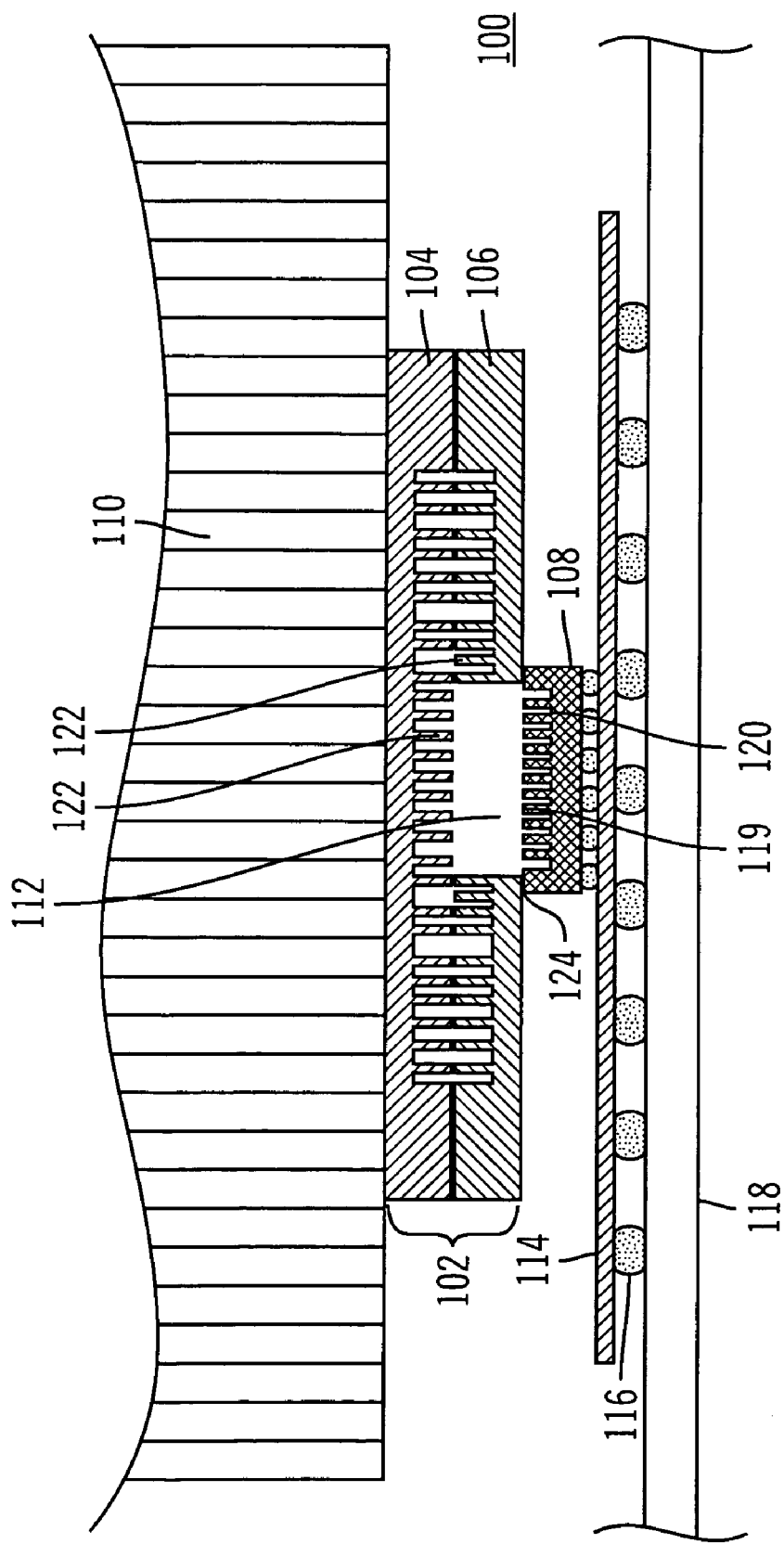
FIG. 1 illustrates a cross sectional diagram of an integrated thermal interposer according to a first embodiment of the present invention.

The present invention, according to preferred embodiments, overcomes problems with the prior art by providing improved vapor chamber heat spreaders for integrated circuit chips and semiconductor devices, such as microprocessors.

Thermal interposers, or heat spreaders, according to several exemplary embodiments of the present invention are described in detail below. These thermal interposers attach directly to the back surface of the semiconductor device (i.e., the surface not containing active devices) so as to give a very low thermal resistance. This provides improved thermal management for the semiconductor device and reduces the total thermal resistance (as compared to conventional structures). In one preferred embodiment of the present invention, a thermal interposer is provided that has two plates containing wick structures such as grooves. The thermal interposer is integrated with a semiconductor device so as to form a vapor chamber. In particular, the back surface of the semiconductor chip is in direct contact with the interior sealed volume of the vapor chamber, so as to greatly reduce the thermal resistance from the combination of the chip and the vapor chamber. Further, the upper plate is thermally coupled to a heat-sinking fixture such as a heat sink or a cold plate.

A wick structure is also provided on the back surface of the semiconductor chip such that it is exposed to the interior sealed volume of the vapor chamber. The wick structures of the plates are formed on the vertical surfaces around the perimeter between the upper and lower plates and on the vertical surface between the lower plate and the back surface of the semiconductor chip. This creates a continuous wick structure that allows the condensed vapor to be returned from the upper plate where it is condensed to the back surface of the semiconductor chip where it is vaporized. Preferably, a filling port is provided to allow the vapor chamber to be evacuated and filled with a working fluid (e.g., water). This filling port is provided along an edge of the two plates or as an opening through one or both of the plates. In one embodiment, the filling port is formed on the lower plate in a region away from the semiconductor chip during the fabrication step that is used to form the opening for the semiconductor chip.

In the preferred embodiment described above, as the integrated circuit chip of the semiconductor device generates heat during operation, the working fluid on the back surface of the semiconductor device in the vapor chamber is vaporized. The working fluid vapor is then condensed on the cold side of the vapor chamber within the wick structure (e.g., grooves) of the upper plate. Capillary force then pulls the working fluid back along the continuous wick structure to the back surface of the semiconductor device, and then the cycle is repeated. Because the working fluid absorbs heat while vaporizing and releases heat while condensing, the heat generated by the integrated circuit chip of the semiconductor device is efficiently transferred to the cold side of the vapor chamber. Additionally, there is a more uniform temperature distribution across the outer surface of the upper plate than on the back surface of the semiconductor chip because the vapor transport through the interior sealed volume of the vapor chamber substantially averages out any non-uniform power density distribution, such as occurs with hot spots on the semiconductor chip.

In preferred embodiments, the vapor chamber is formed of silicon (Si) or a similar rigid material whose thermal expansion is closely matched to silicon. Thus, the vapor chamber can be directly attached to the semiconductor device using solder, silver filled epoxy, or other rigid bonding methods that have a low thermal resistance. In some embodiments, grooves or other wick structures are patterned into the back surface of the semiconductor device in order to provide liquid working fluid directly to the semiconductor chip in order to achieve a low thermal resistance.

During operation, the maximum heat transfer rate of the vapor chamber under certain working conditions is subject to a number of heat transfer limitations. Those limitations depend on the design of the chamber, including the wick structure, and on the operating environment of the chamber. In the context of preferred embodiments of the present invention, the capillary limit and boiling limit are most important. The capillary limit requires that the capillary pressure head is greater than or equal to the sum of the pressure loss along the vapor-liquid path. When the vapor chamber or heat pipe reaches its capillary limit, liquid cannot reach the evaporation region and the heat pipe will dry out so that the temperature locally increases above the boiling point of the working fluid.

The capillary pressure is dependent on the dimensions, shape of the wick structure, and the contact angle of the working fluid with the surface of the wick. In addition, the heat transfer depends on the thickness of the thin liquid film on the evaporation and condenser regions. Therefore, the design of the wick or groove structure is very important for the performance of the heat pipe or vapor chamber. The key parameters are the channel width, the channel pitch, the channel depth, and the interior angle. A smaller interior angle is desirable because it results in a decreased effective pore radius, and thus higher capillary pumping force. With proper wick design, adequate working fluid is provided so as to avoid having the wick dry out even at thermal "hot spots" on the back surface of the semiconductor chip.

FIG. 1 illustrates a cross sectional diagram of an integrated thermal interposer according to a first embodiment of the present invention. The wick structures (or grooves) 120 and 122 are shown in FIG. 1 as being composed of parallel and evenly spaced channels and fins so that the overall structure can be easily understood. However, as will become apparent from subsequent drawings, the configuration of the wick structure in preferred embodiments is significantly more complicated.

As shown in FIG. 1, a semiconductor device 108 has a back surface 119 a wick structure (such as grooves) 120. The integrated thermal interposer 102 has two plates 104 and 106, both having a wick structure 122. These two plates 104 and 106 are bonded together with the wick structures facing each other by soldering, brazing, direct silicon bonding or any other appropriate bonding method that forms a suitable hermetic seal. The upper plate 104 is made of a thermally conductive material, such as silicon, silicon carbide, or diamond, that is compatible with the working fluid to be used in the integrated thermal interposer 102. The lower plate 106 is made of a material having a thermal expansion coefficient compatible to (or the same as) that of the semiconductor device 108, such as silicon, silicon carbide, diamond, or Pyrex.

The wick structure 122 is formed by etching, additive plating, or similar techniques, or a combination of these techniques. The depth of the wick structure 122 and the height of the walls between the wick structure 122 is varied in some embodiments. The lower plate 106 contains an opening 112 that is designed to overlie a portion of the back surface 119 of the semiconductor device 108. The upper plate 104 and lower plate 106 in conjunction with the back surface 119 of the semiconductor device 108 form a vapor chamber structure. Preferably, one or two filling ports are provided in one or both of the plates for use in evacuating and filling the chamber with a working fluid, such as water, alcohol, Freon, fluorinert, acetone, or a solution containing one of these. In this embodiment, the sealed interior of the vapor chamber is at a pressure that is below the outside ambient pressure.

A heat-sinking structure 110 is placed in good thermal contact with the upper plate 104 by using a thermal interface material in order to dissipate heat from the integrated thermal interposer. The front (active) surface of the semiconductor device 108 is electrically connected to a substrate 114 using microsolder balls, and this combination is electrically connected to a printed circuit board 118 by solder balls 116. If the upper plate of the vapor chamber is made of a material that has a high thermal conductivity and enough mechanical strength, the heat sink 110 can be integrated with the top plate of the vapor chamber so as to eliminate the high thermal resistance thermal interface material (TIM).

FIG. 2A illustrates a simplified perspective diagram of the upper plate of the thermal interposer of FIG. 1 as viewed from the sealed interior cavity. As shown, a pattern of grooves 222 is provided on the upper plate 204. The pitch and channel width in the figure is shown larger than actual size for purposes of illustration. The preferred channel width is from about 20 to 500 microns, and more preferably from about 50 to 200 microns. The wall (or fin) width is preferably kept as small as possible, such as about 20 to 100 microns, in order to minimize the channel pitch. As explained above, etching, additive plating, or similar techniques, or a combination of these techniques, is used to form the grooves 222. In further embodiments, other wick structures are used, such as protruding structures in circular patterns, radial patterns, mesh, crossed mesh, or other designs that increase the surface area to facilitate the evaporation as well as function as capillary channels that allow the liquid to return and spread on the heated surface. The depth of the grooves 222 and the height of the walls between the grooves 222 are varied in some embodiments to increase the area available for the transport of the vapor to where it is condensed. The patterning of the wick structure maybe customized for a specific semiconductor device so as to provide additional working fluid to and vapor return paths from designated hot spots of the semiconductor device.

FIGS. 2B(1) through 2B(4) illustrate an exemplary vertical wick structure for transporting the working fluid from the bottom plate to the back surface of the semiconductor chip. A similar type of vertical wick structure is used to transport liquid between the top plate and the bottom plate around the perimeter. FIG. 2B(1) shows a top view and FIGS. 2B(2) through 2B(4) show cross sectional views at various locations. In these figures, the raised wick structure 122 on the bottom plate 106 has upward diagonal cross hatching, the recessed surface between the wick structure 122 on the bottom plate 106 has horizontal cross hatching, the raised wick structure 120 on the back surface 119 of the semiconductor chip 108 has vertical cross hatching, and the back recessed surface between the wick structure 120 has downward diagonal cross hatching. In this embodiment, the region where the lower plate 106 is bonded to the back surface 119 of the semiconductor chip 108 is recessed using the same process that is used to form the wick structure. This allows the wick features to be used in conjunction with the opening 112 in the lower plate 106 to align the two parts to each other when they are assembled.

The vertical wick structure is created when the opening 112 is formed in the lower plate 106 by corrugating the opening edge with "dovetail" vertical slots, the edges of which contact the edges of the grooves (or other wick structures) on the upper surface of the lower plate. The dovetail vertical slots pass through the whole thickness of the lower plate and, when assembled with semiconductor chip 108, narrow slot openings are aligned with the grooves (or other wick structures) 120. A dovetail shaped vertical slot is preferred because the corner with the smaller angle between adjacent vertical sides is more effective at fluid transport by capillary force. However, in further embodiments square and other shapes are used, and a continuous "corner" need not be formed for fluid transport because small gaps of about 10–250 microns, or more preferably about 10–50 microns, can be bridged by surface tension.

Figure 3A:
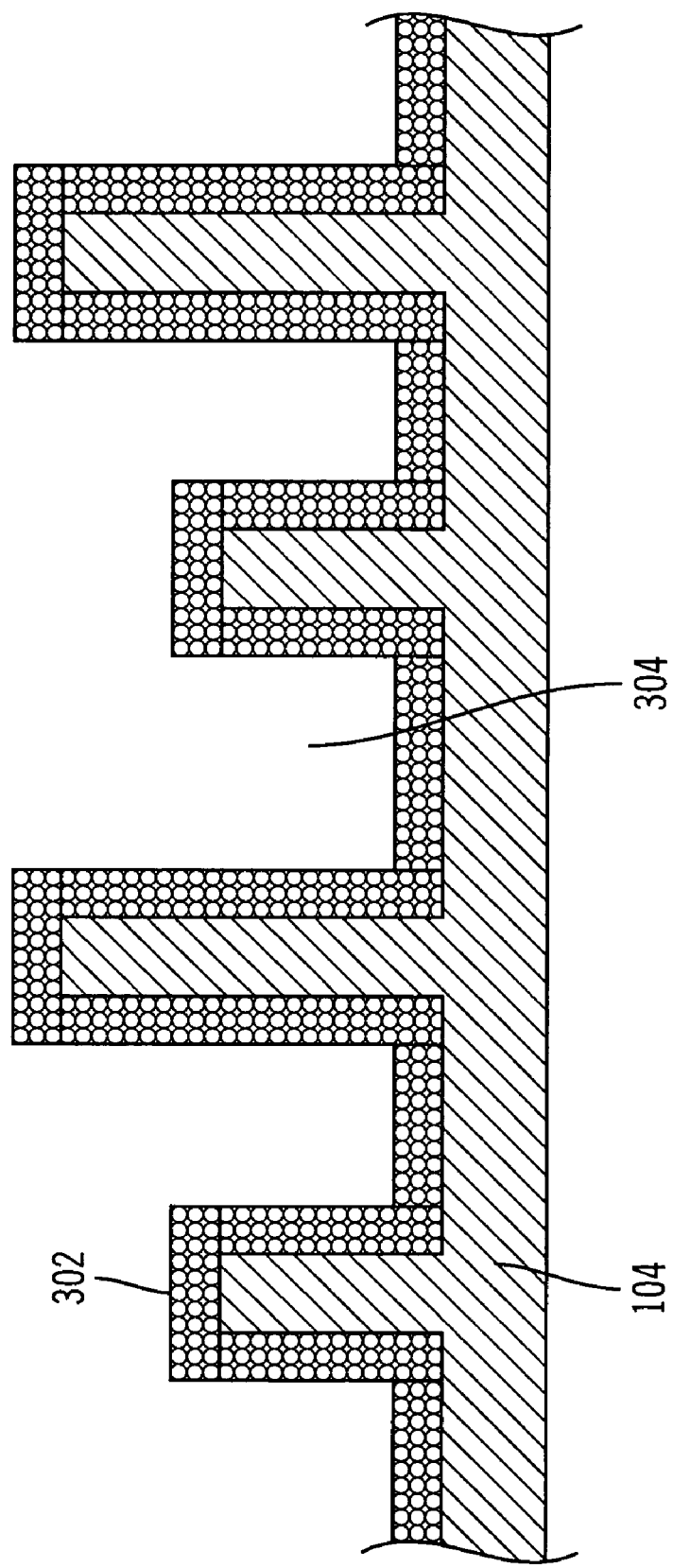
FIG. 3A illustrates in more detail a cross sectional diagram of a portion of the grooves and walls of the upper plate of FIG. 2A.

FIG. 3A illustrates in more detail a cross sectional diagram of a portion of the grooves and walls of the upper and/or lower plate of FIG. 1. In this exemplary embodiment, the features that form the wick structure are formed with two different heights (from the recessed portion of the plate 104 or 106). Although this requires additional processing, it allows additional space and openings to be provided for the transport of the vaporized working fluid. Additionally, in this embodiment the wick structure (e.g., grooves) and walls of the upper plate and/or lower plate are etched so as to form a coating of porous silicon 302. For example, porous silicon can be formed by electrochemical etching, photo-induced chemical etching, or chemical etching.

The upper or lower plates 104 and 106 of this embodiment are made of silicon, and the exposed silicon surfaces are further processed to form the layer of porous silicon 302. In various embodiments, the porous silicon 302 covers the walls between the grooves 304, the bottoms of the grooves, the tops of the walls between the fins, or all of these (as in the embodiment of FIG. 3A). With additional processing for forming appropriate etch resistant layers in the desired locations, porous silicon can be formed only on the sides of the wicking structures, only on the recessed surfaces between the raised walls (or fins), or on both. The porous silicon 302 greatly increases the surface area so as to provide better heat transfer on the evaporator and condenser as well as an increased wicking action to return the working fluid to the semiconductor chip where it is vaporized.

The thermal interposer of FIG. 1 reduces the thermal resistance between the semiconductor device and its heat sink as compared to conventional thermal management techniques. The back side of the semiconductor device forms the hot side of the vapor chamber, and the condenser side of the vapor chamber is formed by the upper plate that is in contact with the heat sink. During operation, the semiconductor device generates heat, so the working fluid (e.g., water) in the wick structure on the back side of the semiconductor device is vaporized. The working fluid vapor is condensed at the cold side of the vapor chamber within the wick structure (e.g., grooves) on the upper plate. Capillary forces return the condensed working fluid along the continuous wick structure to the back side of the semiconductor device, where it is vaporized again and the cycle repeats. The working fluid absorbs heat during vaporization and releases heat during condensation, so as to transfer the heat generated by the semiconductor device to the cold side of the vapor chamber with a low thermal resistance.

Further, in the embodiment of FIG. 1, the plates of the thermal interposer extend outward beyond the perimeter of the semiconductor device so that the thermal interposer functions as a compact and efficient thermal spreader. By spreading the heat and reducing the heat flux ($W/cm^2$) at the next interface, the total temperature drop between the semiconductor device and the heat sink is reduced. In preferred embodiments, the same material (e.g., silicon) is used to form the top and bottom plates of the thermal interposer and the semiconductor device (i.e., integrated circuit chip) to avoid thermal expansion mismatch problems. More specifically, typical hermetic bonding methods (such as solders) result in rigid joints, so it is generally desirable to form the top and bottom plates of the same material, or materials with little thermal expansion mismatch. In embodiments in which solder or other rigid bonding methods are used to attach the thermal interposer to the semiconductor chip, it is desirable to use a thin solder joint or other solid state bonding method for attachment in order to minimize the thermal resistance between the chip and the lower plate of the thermal interposer.

Figure 3B:
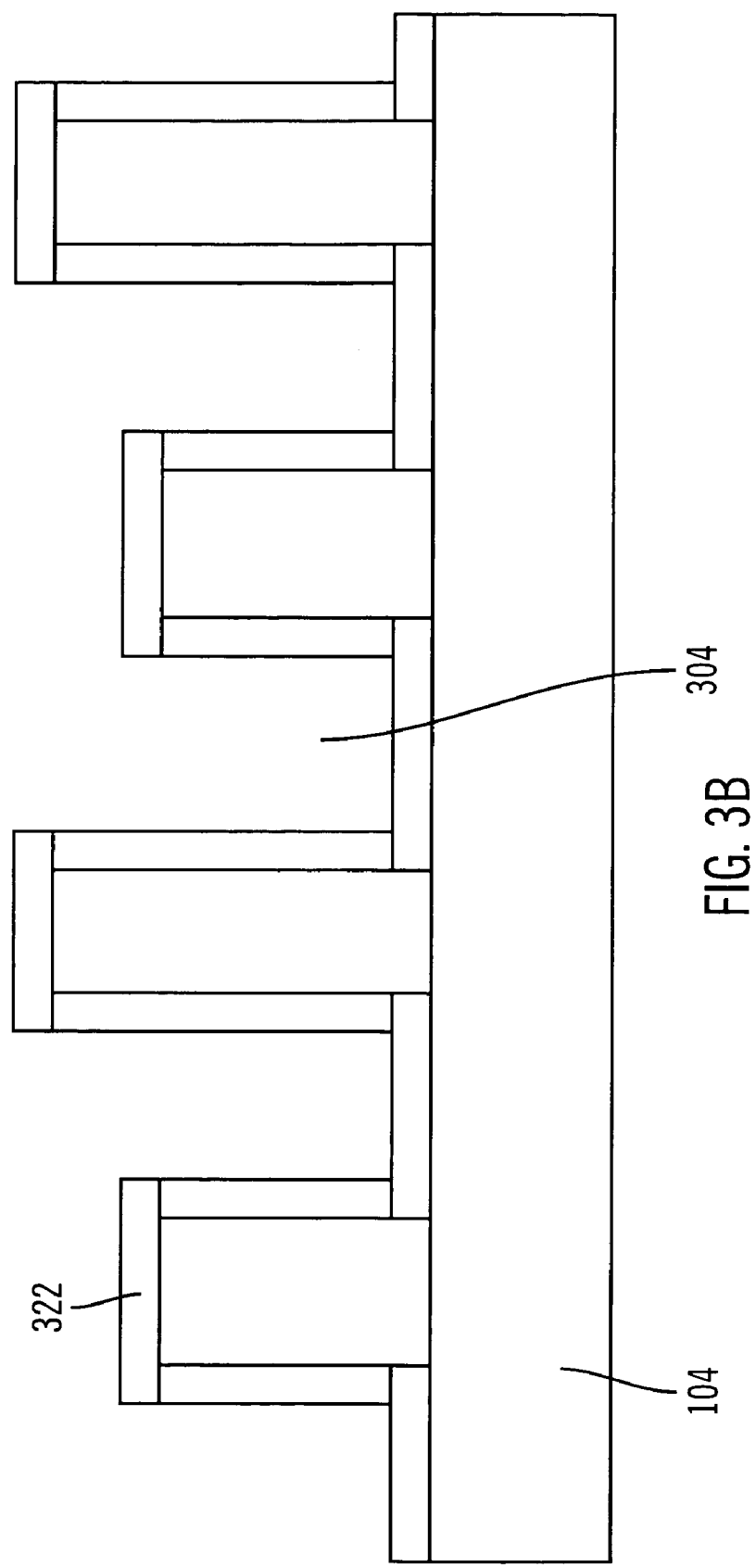
FIG. 3B illustrates a cross sectional diagram of a portion of the grooves and walls of an upper plate of a thermal interposer according to a second embodiment of the present invention.

FIG. 3B illustrates a cross sectional view of a portion of the grooves and walls of an upper plate of a thermal interposer according to a second embodiment of the present invention. In this embodiment, a section of the wick structure (e.g., grooves) and walls 304 of the upper plate and/or the lower plate are covered with a layer 322 of graphite foam, graphite fiber, or carbon nanotubes. More specifically, the upper plate 104 and/or the lower plate 106 are made of silicon, and the surfaces of the wick structure are further processed so as to deposit or otherwise add anisotropic graphite foam, graphite fiber, or carbon nanotubes onto them. In various embodiments, the graphite foam, graphite fiber, or carbon nanotubes 322 cover some or all of the wick structures. This added layer 322 of material greatly increases the surface area so as to provide increased wicking action to return the working fluid to the semiconductor chip where it is vaporized. Further, the high thermal conductivity of the graphite foam, graphite fiber, or carbon nanotubes increases the performance of the thermal interposer.

FIGS. 2C(1) through 2C(3) illustrate another embodiment of an integrated thermal interposer according to the present invention. In this embodiment, an array of small openings is provided in the lower plate, instead of the single large opening. The spacing of the small openings is kept small (e.g., on the order of about half the thickness of the semiconductor chip, or about 300 microns or less) so the semiconductor chip 108 acts as a thermal spreader. Thus, a wick structure on the back surface of the semiconductor chip for distributing the working fluid is not needed. Also, multiple small openings are easier to fabricate if a silicon plate is used. In the top view of FIG. 2C(2), the dotted line indicates the outline of the chip and an array of square openings are shown. These openings open down to the back surface of the chip 108. The detailed top view of FIG. 2C(3) shows a single opening in more detail. As shown, a vertical wick structure is formed around the perimeter of the opening, as described above.

In these top views, the wick structure on the inner surface of the lower plate is not shown for clarity. This wick structure is designed to conduct the condensed working fluid to the vertical wick structure described above. The vaporized working fluid is transported up one of the array of small openings, condenses on the wick structure on the upper plate, and then is transported back to the chip by the vertical wick structure around the perimeter (i.e., where the upper and lower plates are joined together), then by the wick structure on the surface of the lower plate, and then by the vertical wick structure in the array of small openings so as to reach the back surface of the semiconductor chip.

FIGS. 2D(1) through 2D(3) illustrate yet another embodiment of an integrated thermal interposer according to the present invention. In this embodiment, a secondary wick structure is formed from a combination of features on the upper and lower plates in order to provide condensed working fluid to the array of multiple small openings. In the top view shown in FIG. 2D(2), the dotted line indicates the outline of the chip. Arrays of rectangular openings extend down to the back surface of the semiconductor chip (shown in white), with arrays of rectangular projections upward (shown in horizontal cross hatching). The detailed top view of FIG. 2D(3) shows the vertical wick structures that are formed on the sides of the upward projecting shapes and continue down along the sides of the small openings to the back surface of the semiconductor chip. Matching features are formed on the inner surface of the upper plate, and the wick structure on the upper plate is design so that when the upper and lower plates are assembled together, condensed working fluid is provided to the vertical wick structures.

The provision of a secondary wick structure for providing condensed working fluid directly to the back surface of the semiconductor chip significantly increases the maximum power density for which this cooling structure can be used. In a further embodiment, the secondary wick structure that facilitates returning the condensed fluid to the evaporation zone is placed on both the evaporation plate and the condensation plate. Such a structure can be formed by the superposition of some interconnected larger width or depth channels with larger repeating pitch (compared to the primary grooves or wick structures). Such secondary wick structure can extend the capillary limit, prevent dry-out, and increase the heat transfer rate.

Figure 4:
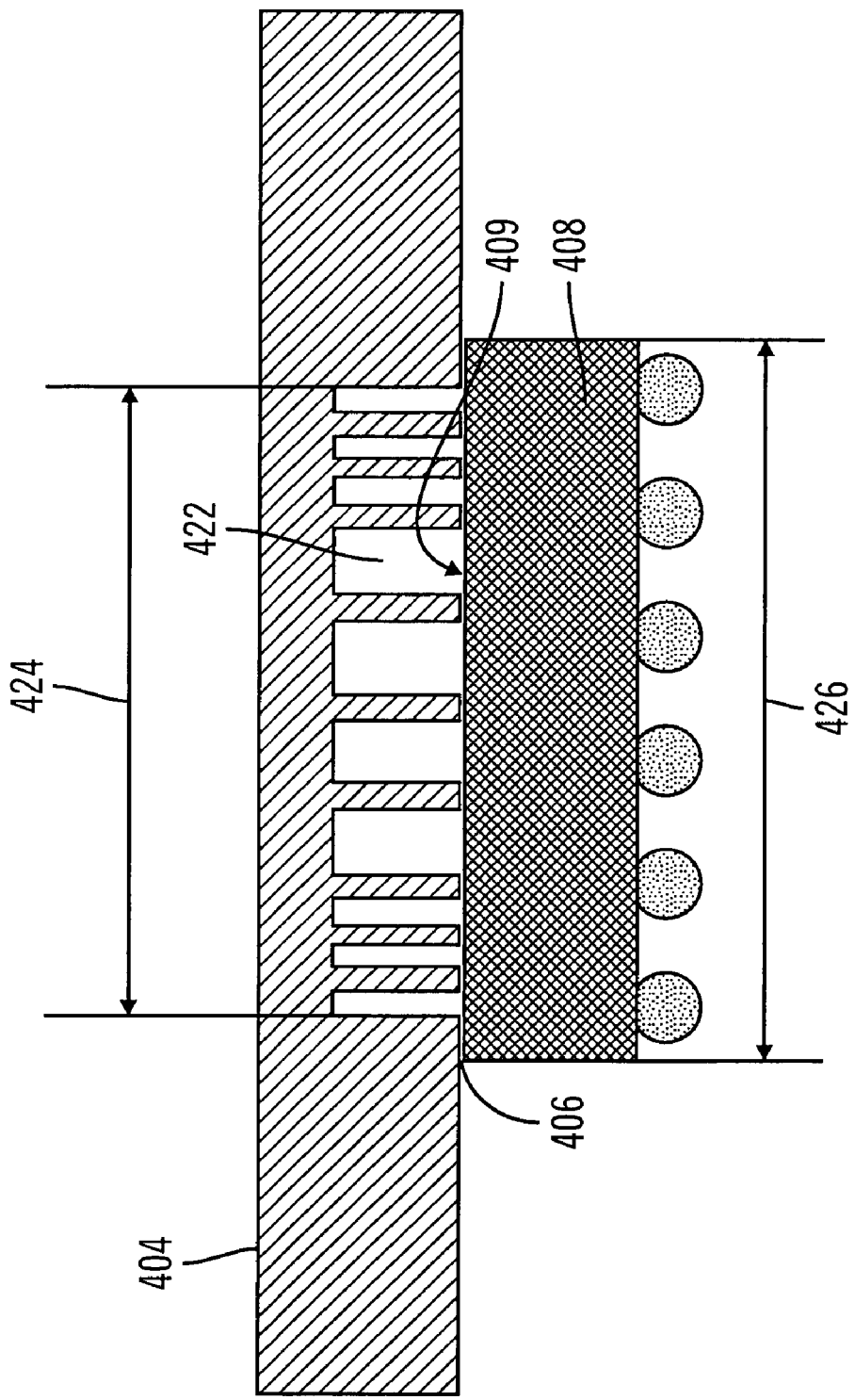
FIG. 4 illustrates a cross sectional diagram of an integrated thermal interposer having one plate according to a third embodiment of the present invention.

FIG. 4 illustrates a cross sectional diagram of an integrated thermal interposer having one plate according to a third embodiment of the present invention. As shown, a single plate 404 with grooves 422 is bonded directly to the back surface of a semiconductor device 408. The grooved (or other wick structured) portion 424 of the plate is dimensioned so as to be over the area 426 of the back surface 409 of the semiconductor device 408. Once the bonding areas of the plate 404 and the back surface of the semiconductor device 408 are aligned and bonded together by use of a solder band or similar hermetic bonding material 406, they can be evacuated and filled with a suitable working fluid (e.g., via a fill port on the side or back of the plate 404) to form a vapor chamber structure. A heat-sink fixture can be thermally coupled to the top of the plate 404, as in the embodiment of FIG. 1. Additionally, a substrate can be attached to the bottom surface of the semiconductor device 408 for electrical connection to a printed circuit board, as in the embodiment of FIG. 1.

Preferably, in embodiments in which the back surface 409 of the semiconductor device 408 is flat (i.e., it does not contain any wick structure), the walls or fins that form the wick structure on plate 404 are either bonded to the back surface 409 of the semiconductor device or have only a small separation (e.g., 10–250 microns, and preferably 10–50 microns) that can be bridged by surface tension. Additionally, it is preferable in such embodiments for the wick structure to be equipped with a vertical wick structure (such as the one shown in FIG. 2B(1)) so that a continuous wick exists to provide the working fluid to all areas of semiconductor chip 408 that are exposed to the vapor chamber. The bulk of the semiconductor chip 408 acts as a thermal spreader, so it is only necessary to provide a vertical wick structure on a length scale comparable with the thickness of the semiconductor chip 408. Further, while in the illustrated embodiment the back surface 409 of the semiconductor device 408 is flat to reduce manufacturing complexity, the back surface 409 of the semiconductor device 408 can alternatively be provided with grooves or other wick structures, as in the embodiment of FIG. 1.

While in this embodiment the vapor chamber portion of the structure does not significantly reduce the average power density because the dimensions of the vapor chamber are less than the dimensions of the chip 408, the vapor chamber does act to reduce local variations in the power density, such as hot spots. By reducing the peak power density that must be cooled, a less complicated cooling solution with a higher total thermal resistance can be used to maintain the semiconductor chip at a low enough temperature for reliable operation.

Figure 5:
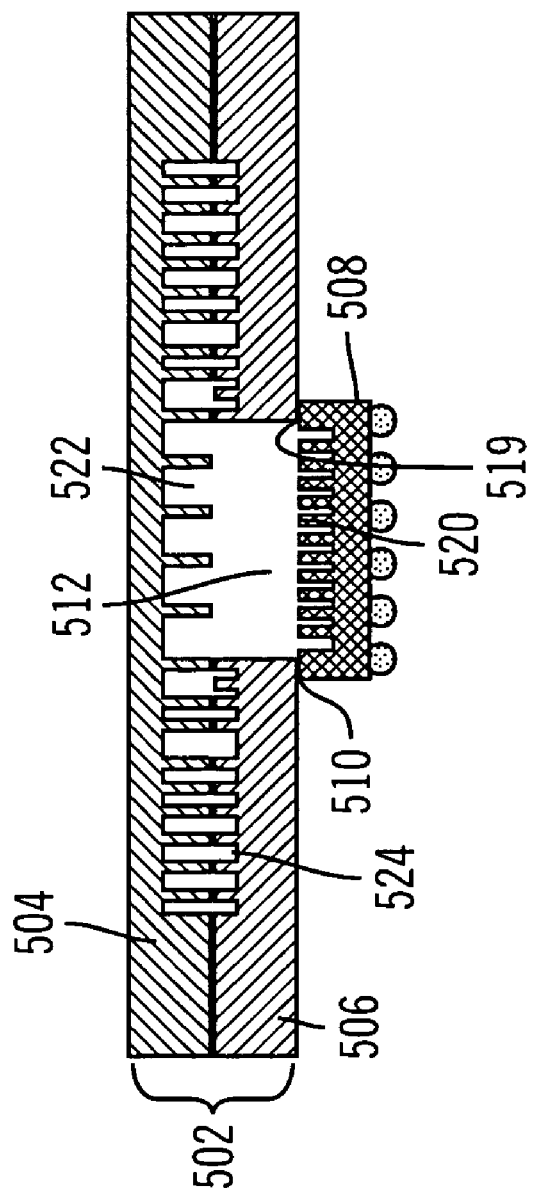
FIG. 5 illustrates a cross sectional diagram of an integrated thermal interposer with a metal plate and a Pyrex plate according to a fourth embodiment of the present invention.

FIG. 5 illustrates a cross sectional diagram of an integrated thermal interposer composed of different materials according to a fourth embodiment of the present invention. As shown, the thermal interposer 502 includes an upper plate 504 and a lower plate 506, both of which are equipped with wick structures. A semiconductor device 508 has a back surface 519 with a wick structure 520 (e.g., grooves). The upper plate 504 is made of a material that has a high thermal conductivity and a coefficient of thermal expansion that is close to that of the material used for the lower plate 506. The lower plate 506 is made of a material that has a coefficient of thermal expansion that is close to that of the material used to make the semiconductor device 508. (The material from which the lower plate 506 is made need not have a high thermal conductivity because the lower plate is not part of the primary thermal path for cooling the semiconductor device 508.) For example, in various embodiments, the lower plate 506 is fabricated from a glass, Pyrex, or a ceramic, and the upper plate 504 is fabricated from silicon carbide, diamond, or a metallic alloy or composite with a low coefficient of thermal expansion (such as Alloy 42 or Cu—Mo composites).

The upper plate 504 contains a wick structure 522 (such as grooves) and the lower plate 506 also contains a wick structure 524 (such as grooves). The upper plate 504 is hermetically bonded to the lower plate 506 using an appropriate solder, glass frit, fusion, or other bonding method. As described above, vertical wick structures are used to provide a continuous wick structure to return the working fluid, after it condenses on the upper plate 504, to the wick structure 520 on the semiconductor chip 508. The grooves 522 and 524 on the plates are formed by etching, additive plating, or similar techniques, or a combination of these techniques. In various embodiments, the depth of the grooves 522 and 524 and/or the height of the walls between the grooves 522 and 524 are varied.

As shown in FIG. 5, the lower plate 506 contains an opening 512 that overlies a portion of the back surface 519 of the semiconductor device 508. The upper plate 504 and the lower plate 506, in conjunction with the semiconductor device 508, form a vapor chamber structure. The wick structure 520 on the back surface of semiconductor can be configured to aid in the alignment of the semiconductor chip 508 with the opening 512 in the lower plate 506, as in the embodiment of FIG. 2B. A filling port is provided for evacuating and filling the chamber with a working fluid, such as water. In various embodiments, the filling port is located on the side of the upper and lower plates 504 and 506, or on one of the horizontal surfaces of either plate.

Figure 6:
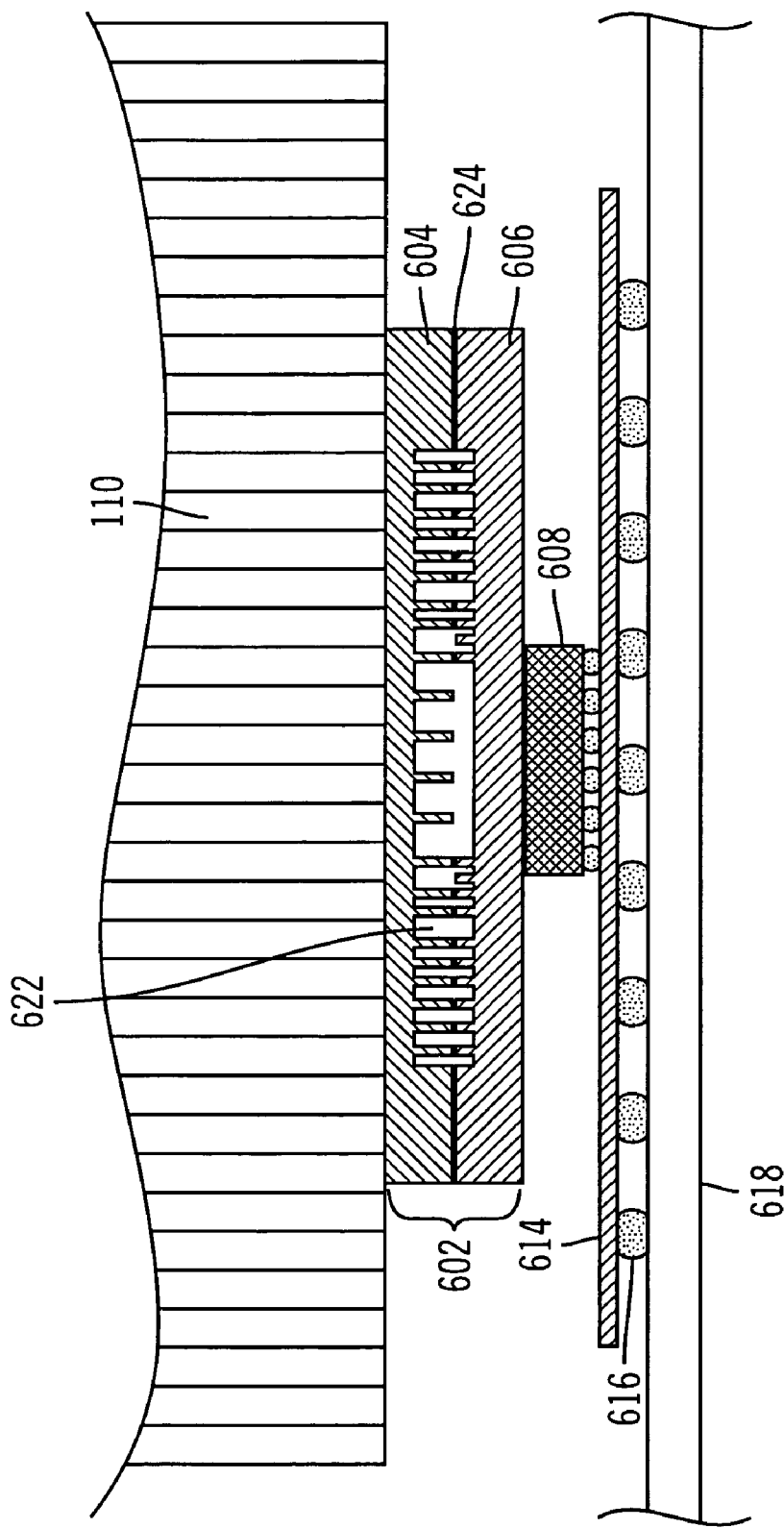
FIG. 6 illustrates a cross sectional diagram of a thermal interposer according to a fifth embodiment of the present invention.

FIG. 6 illustrates a cross sectional diagram of a thermal interposer according to a fifth embodiment of the present invention. As shown, the thermal interposer 602 of this embodiment includes two plates 604 and 606. A semiconductor device 608 is electrically connected to a substrate 614, which is electrically connected to a printed circuit board 618 via solder balls 616. The plates 604 and 606 each have wick structures 622, (such as grooves) and are bonded together such that the wick structures 622 face each other. In this embodiment, the plates 604 and 606 are formed from materials having a high thermal conductivity and a coefficient of thermal expansion that is close to that of silicon, or the material from which the semiconductor device is fabricated. The plates 604 and 606 alone (i.e., without the semiconductor device 608) form a vapor chamber in this embodiment. A fill port 624 is provided on one side of the thermal interposer 602 for evacuating and filling the chamber of the thermal interposer 602 with a working fluid. In further embodiments, the fill port is formed anywhere on one of the major surfaces of the plates 604 or 606, or on one side of the thermal interposer 602.

The thermal interposer 602 is placed between the semiconductor device 608 and a heat-sinking device 110. Preferably, the thermal interposer 602 is rigidly bonded to the semiconductor chip 608 with a low thermal resistance. The plates 604 and 606 are made of highly thermally conductive materials such as silicon, silicon carbide, diamond or other appropriate materials. In a preferred embodiment, the rigid bond used between the thermal interposer 602 and the semiconductor device 608 is a low-melting-point solder, and the lower plate 606 is made of a thermally conductive material with a thermal expansion coefficient compatible to the semiconductor device 608. In further embodiments, the rigid bond is formed through other methods, such as eutectic bonding, oxide bonding, or direct silicon bonding. Additionally, a non-hermetic, low thermal resistance rigid bond between the semiconductor device 608 and the lower plate 606 can be formed by using filled polymer materials such as a silver filled epoxy.

Figure 7:
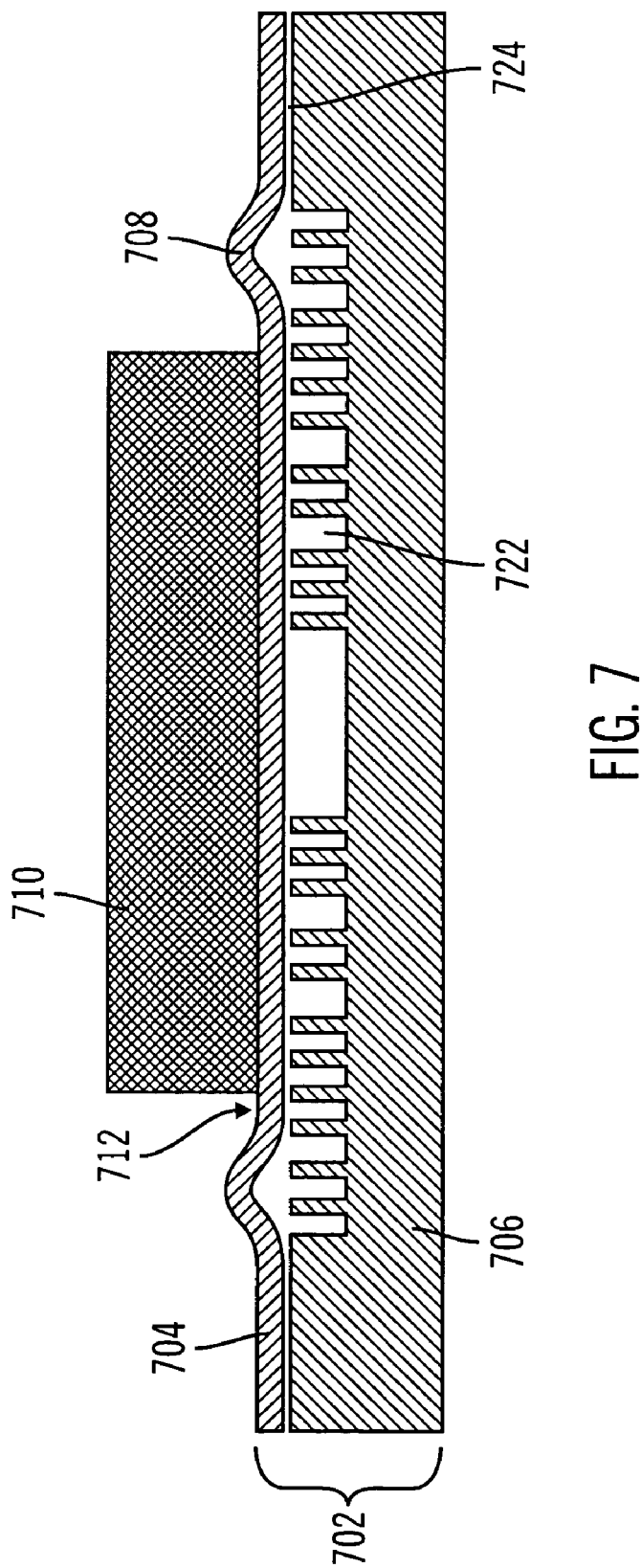
FIG. 7 illustrates a cross sectional diagram of a thermal interposer with a thin metal cover bonded on a metal plate according to a sixth embodiment of the present invention.

FIG. 7 illustrates a cross sectional diagram of a thermal interposer according to a sixth embodiment of the present invention. In this embodiment, the thermal interposer includes a thin metal cover bonded on a lower plate that is formed from a material with a thermal expansion coefficient similar to that of the semiconductor chip to which it is bonded. As shown in FIG. 7, the thermal interposer 702 includes a thin metal plate 704 and a lower plate 706. The thin metal plate 704 is hermetically bonded on the lower plate 706, which has a wick structure 722 (such as grooves) that includes vertical wick features around the perimeter. The bottom surface of the thin metal plate 704 contains a wick structure (such as a sintered metal particles, bonded wire mesh, or grooves) in the region that forms the vapor chamber. The thin metal plate 704 has corrugations 708 near the periphery area of the plate 704 that flex to accommodate the differential thermal expansion between the thin metal plate 704 and the lower plate 706.

A metal connection block 710 is bonded (for example, by soldering or brazing) on the top surface of the thin metal plate 704. The metal connection block 710 preferably has several tap holes for mounting via fasteners a heat-sinking fixture, as in the embodiment of FIG. 1. The lower plate 706 is rigidly bonded to a semiconductor device with a low thermal resistance, as in the previous embodiment. A vapor chamber is formed by bonding the plates 704 and 706 together. A fill port 724 is provided for evacuating and filling the vapor chamber with a working fluid, such as water. In an alternative embodiment, the lower plate 706 contains an opening 112 that overlies a portion of the back surface 119 of the semiconductor device, as in the embodiment of FIG. 1. In such an embodiment, the semiconductor device may or may not be provided with grooves.

Figure 8A:
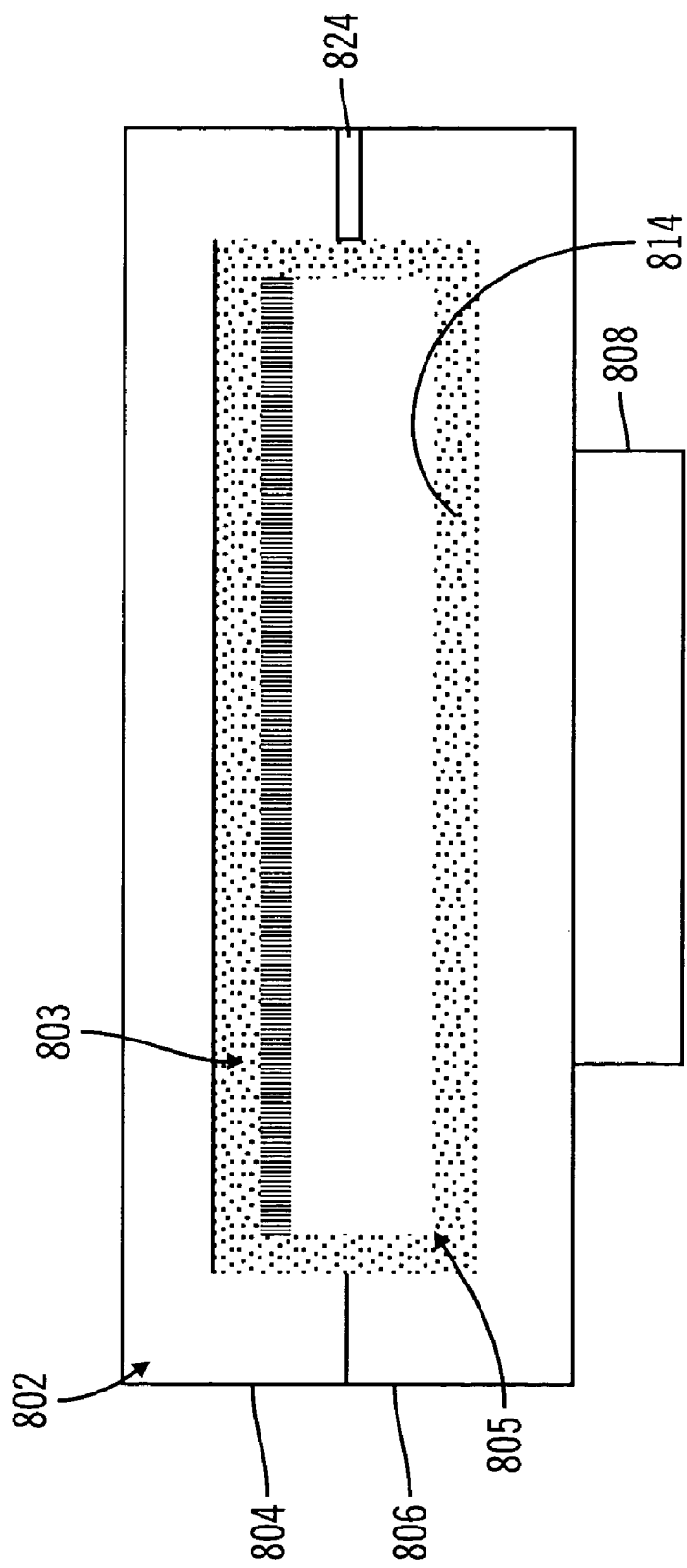
FIG. 8A illustrates a cross sectional diagram of a thermal interposer having graphite foam wicks according to a seventh embodiment of the present invention.

FIG. 8A illustrates a cross sectional diagram of a thermal interposer having graphite foam wicks according to a seventh embodiment of the present invention. As shown, the thermal interposer 802 includes an upper plate 804 and a lower plate 806, which are hermetically bonded together to form a vapor chamber structure. Graphite foam wicks 814 are deposited or bonded onto the internal surface of the lower plate 804 or the internal surfaces of both lower and upper plates 804 and 806. The plates 804 and 806 are formed of materials that are highly thermally conductive and that have a small thermal expansion mismatch with the chip 808, (e.g., materials such as silicon, silicon carbide, or diamond). The lower plate 806 is rigidly bonded with a low thermal resistance to a semiconductor device 808 (i.e., integrated circuit chip), as described above. A fill port 824 is provided for evacuating and filling the vapor chamber with a working fluid, such as water. The graphite foam wicks 814 greatly increase the surface area so as to provide increased wicking action to return the working fluid to the region above the semiconductor chip where it is vaporized.

Figure 8B:
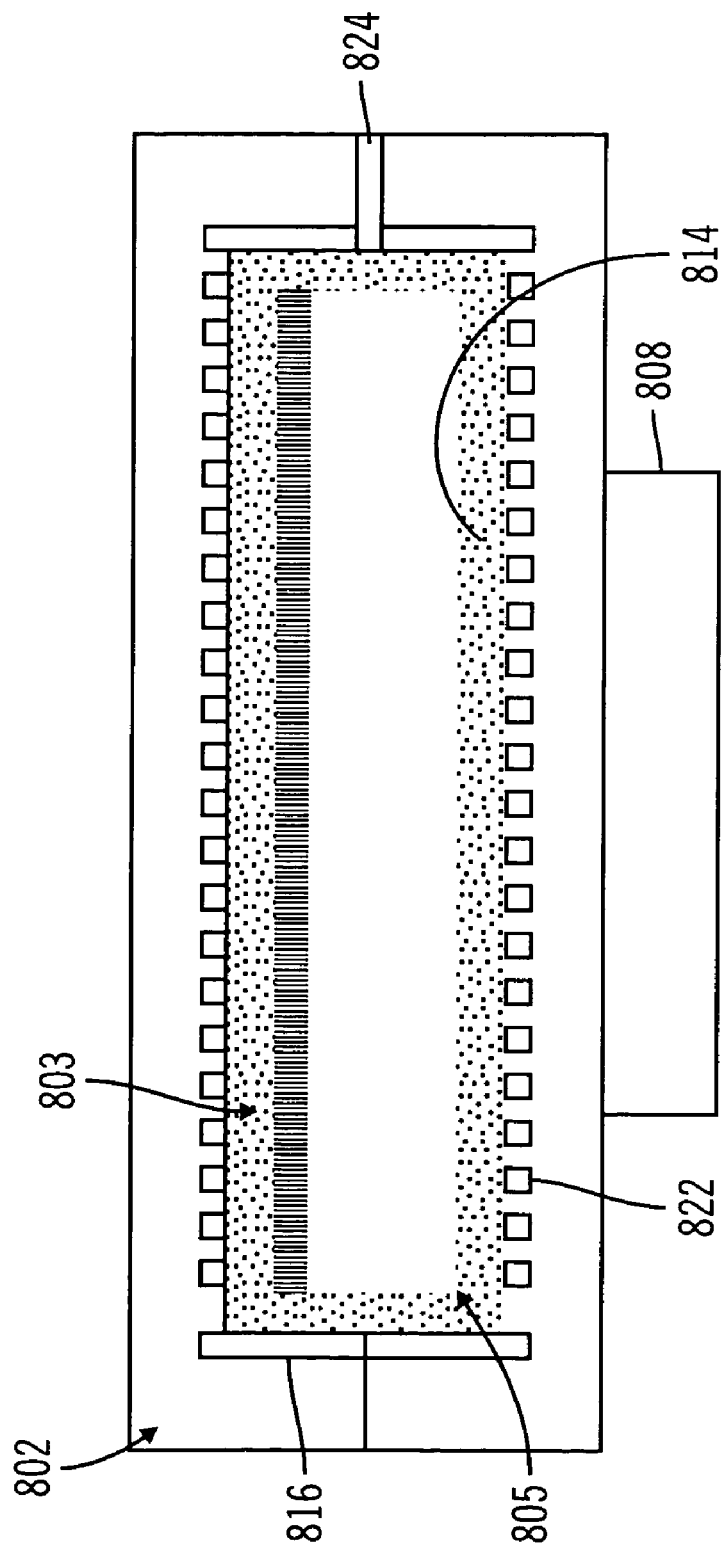
FIG. 8B illustrates a cross sectional diagram of a thermal interposer with microgrooves and graphite foam wicks according to an eighth embodiment of the present invention.

FIG. 8B illustrates a cross sectional diagram of a thermal interposer with microgrooves and graphite foam wicks according to an eighth embodiment of the present invention. As shown, the thermal interposer 802 includes an upper plate 804 and a lower plate 806, each having microgrooves 822 on one of their surfaces. The two plates 804 and 806 are hermetically bonded together such that the grooved surfaces face each other to form a vapor chamber structure. Graphite foam wicks 814 are deposited or bonded onto the internal surfaces of the lower plate 804 or both lower and upper plates 804 and 806. The lower plate 806 is rigidly bonded to a semiconductor device 808 with a lower thermal resistance bond, as described above. A fill port 824 is provided for evacuating and filling the vapor chamber with a working fluid, such as water.

The graphite foam wicks 814 greatly increase the surface area so as to provide increased heat transfer on the evaporator and condenser, as well as increased wicking action to return the working fluid to the region above semiconductor chip where it is vaporized. The wicking action (i.e., capillary force) is increased further by the microgrooves 822 and sidewall grooves (vertical wick structure) 816. The increased wicking action reduces the thermal resistance of the thermal interposer. (In some embodiments, the sidewall grooves 816 are not provided.)

Figure 8C:
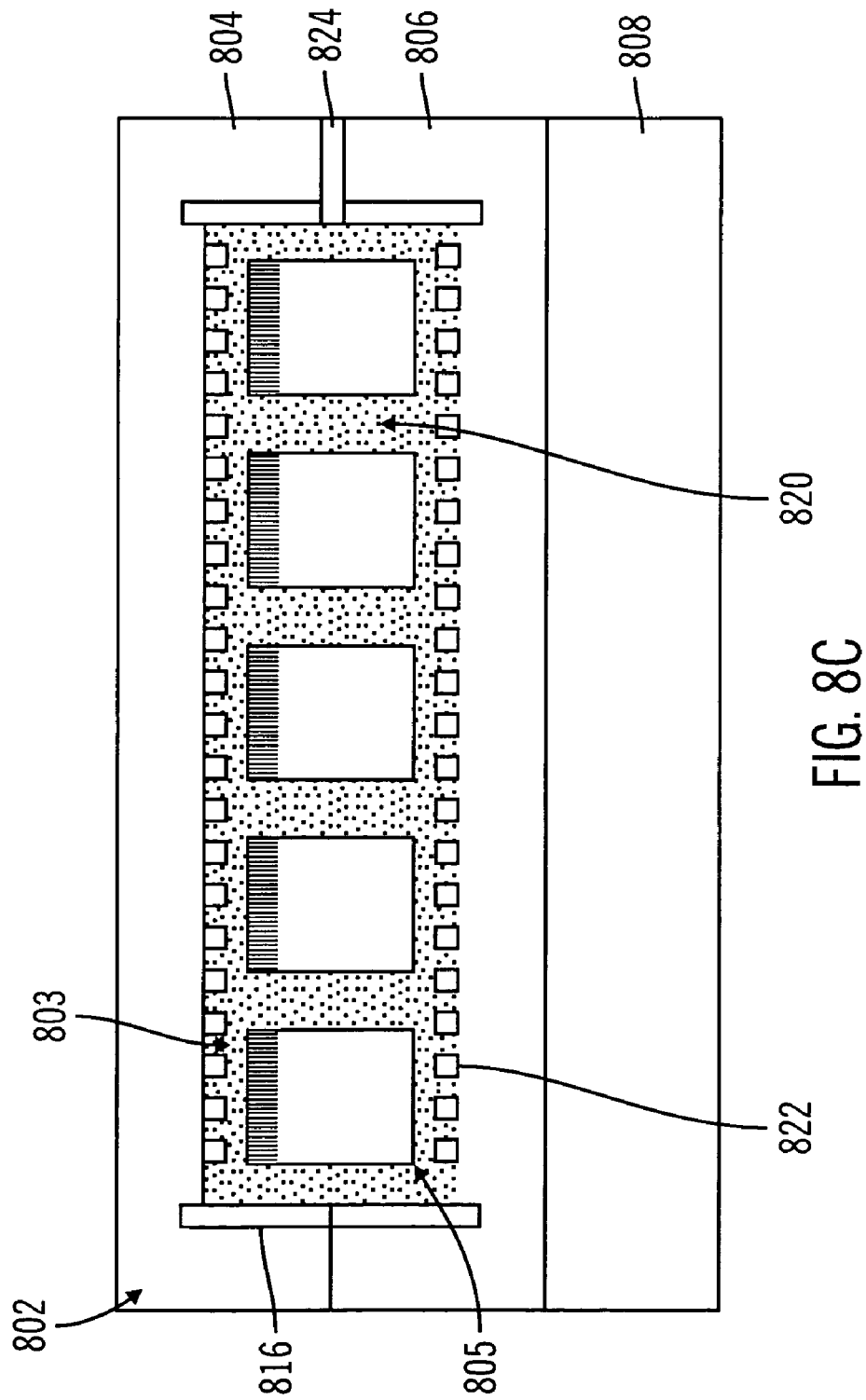
FIG. 8C illustrates a cross sectional diagram of a thermal interposer with microgrooves, graphite foam wicks and graphite foam pillars according to a ninth embodiment of the present invention.

FIG. 8C illustrates a cross sectional diagram of a thermal interposer with microgrooves, graphite foam wicks, and graphite foam pillars according to a ninth embodiment of the present invention. As shown, the thermal interposer includes an upper plate 804 and a lower plate 806, each having microgrooves 822 on one of their surfaces. The two plates 804 and 806 are hermetically bonded together such that the grooved surfaces face each other to form a vapor chamber structure. Graphite foam wicks 814 are deposited or bonded onto the internal surfaces of the lower plate 804 or both lower and upper plates 804 and 806. The lower plate 806 is rigidly bonded to a semiconductor device 808 with a lower thermal resistance bond, as described above. A fill port 824 is provided for evacuating and filling the vapor chamber with a working fluid, such as water.

The graphite foam wicks 814 greatly increase the surface area so as to provide increased heat transfer on the evaporator and the condenser, as well as increased wicking action to return the working fluid to the region above semiconductor chip where it is vaporized. The wicking action (i.e., capillary force) is increased further by the microgrooves 822 and sidewall grooves (vertical wick structure) 816. The increased wicking action reduces the thermal resistance of the thermal interposer. (In some embodiments, the sidewall grooves 816 are not provided.) Additionally, graphite foam pillars 820 are connected between the microgrooved surfaces of the two plates 804 and 806. These graphite foam pillars 820 form additional secondary wicks to assist in returning the working fluid to the evaporator section 805 of the vapor chamber structure.

Figure 8D:
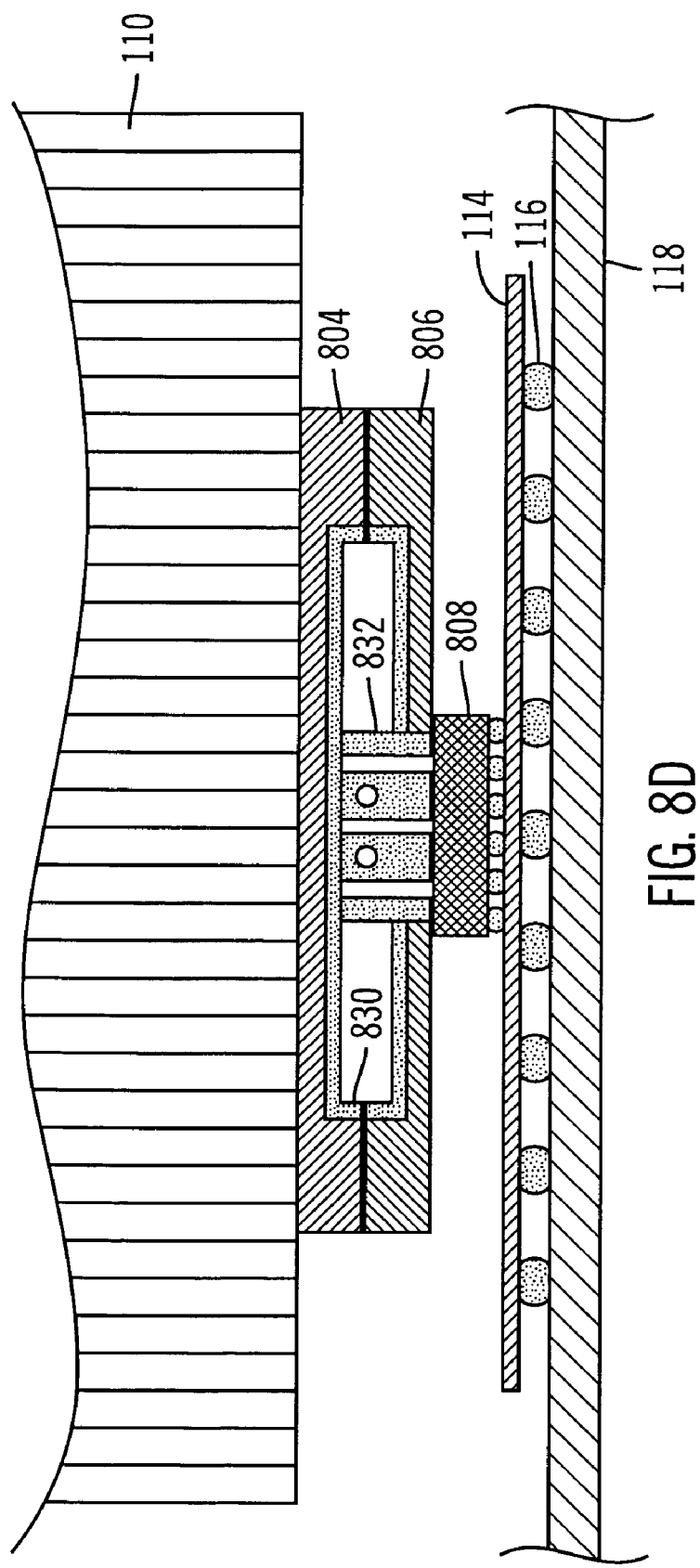
FIG. 8D illustrates a cross sectional diagram of a thermal interposer with graphite foam wicks and graphite foam pillars in direct contact with the chip according to a tenth embodiment of the present invention.
Figure 9:
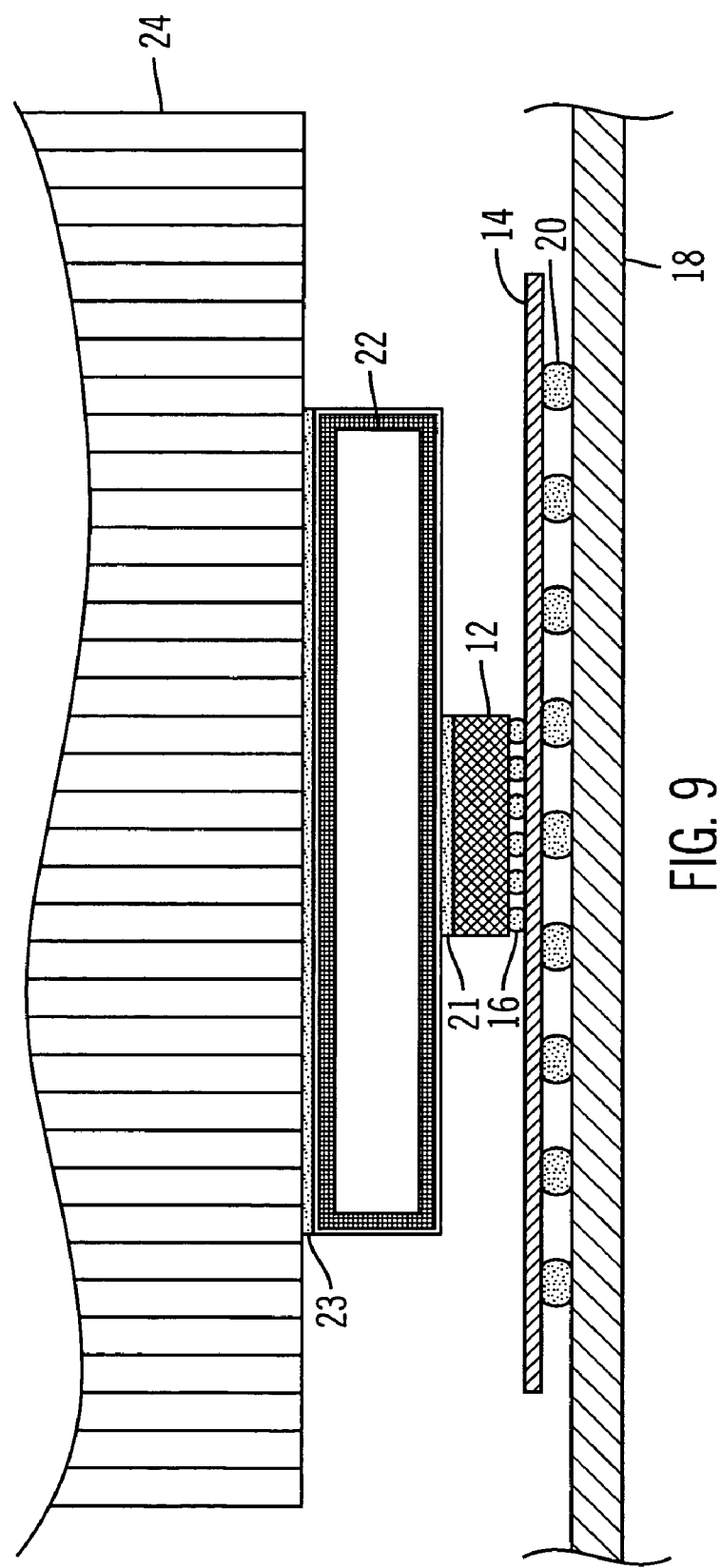
FIG. 9 illustrates a cross sectional diagram of a conventional thermal management structure that includes a vapor chamber and an air cooled heat sink.

FIG. 8D illustrates a cross sectional diagram of a thermal interposer with graphite foam wicks and graphite foam pillars in direct contact with the chip according to a tenth embodiment of the present invention. As shown, the thermal interposer includes an upper plate 804 and a lower plate 806. The two plates 804 and 806 are hermetically bonded together, and the lower plate 806 contains an opening that overlies a portion of the back surface of a semiconductor device 808. The upper plate 804 and the lower plate 806, in conjunction with the semiconductor device 808, form a vapor chamber structure.

The interior of the vapor chamber is lined with graphite foam 830. A graphite foam block 832 that is penetrated by a number of intersecting channels (as could be formed by drilling) is used to interconnect the wick structure on the upper plate with the back surface of the semiconductor chip to form a secondary wick. The graphite foam block 832 is preferably bonded to the back surface of the semiconductor chip to improve the heat transfer. A number of vertical openings are formed in the graphite foam block 832 for transporting the vaporized working fluid. These vertical channels are interconnected with horizontal channels, which are interconnected with the cavity formed by the upper and lower plates, so as to provide a means for the vaporized work fluid to return to the graphite foam wick on the upper plate.

In various embodiments, the plates of the vapor chamber are made from silicon, AlSiC, SiSiC, copper, glass, or another material with high thermal conductivity (i.e., greater than or equal to 100 W/m-K), with or without CTE matching. Preferably, the inner walls of the plates have groove structures.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An integrated circuit device comprising:
    a semiconductor device having a front surface containing active devices and a back surface that does not contain active devices, the semiconductor device being made of a material having a coefficient of thermal expansion;
    an upper plate having a bottom surface with a plurality of grooves and a top surface, the upper plate being made of a material having high thermal conductivity; and
    a lower plate having a top surface with a plurality of grooves and a bottom surface, the lower plate being made of a material having a coefficient of thermal expansion that is substantially the same as the coefficient of thermal expansion of the material of which the semiconductor device is made,
    wherein the bottom surface of the upper plate is hermetically bonded to the top surface of the lower plate,
    one opening extends through the lower plate, and
    the back surface of the semiconductor device is hermetically bonded to the bottom surface of the lower plate so as to completely cover the opening in the lower plate, so that a vapor chamber is formed by the semiconductor device and the upper and lower plates.

2. The integrated circuit device of claim 1, wherein a plurality of grooves are provided on the back surface of the semiconductor device.

3. The integrated circuit device of claim 2, wherein the opening through the lower plate has a corrugated edge forming vertical slots, each of the vertical slots contacting at least one of the grooves on the top surface of the lower plate and opening into at least one of the grooves on the back surface of the semiconductor device, so as to act as a vertical wick structure for transporting condensed working fluid from the top surface of the lower plate directly to the back surface of the semiconductor device.

4. The integrated circuit device of claim 3, wherein the vertical slots have a dovetail shape.

5. The integrated circuit device of claim 1, further comprising a heat-sinking structure attached to the top surface of the upper plate via a layer of Thermal Interface Materials, an area of the heat-sinking structure that is in contact with the top surface of the upper plate being greater than an area of the bottom surface of the lower plate that is in contact with the back surface of the semiconductor device.

6. The integrated circuit device of claim 1, wherein the grooves on the bottom surface of the upper plate and the grooves on the top surface of the lower plates comprise a plurality of walls with outer surfaces, a porous silicon layer covering the outer surfaces of at least some of the walls.

7. The integrated circuit device of claim 1, wherein the grooves on the bottom surface of the upper plate and the grooves on the top surface of the lower plates comprise a plurality of walls with outer surfaces, the outer surfaces of at least some of the walls being covered with at least one material selected from the group consisting of graphite foam, graphite fiber, and carbon nanotubes.

8. The integrated circuit device of claim 1, wherein the upper plate is formed of a material selected from the group consisting of silicon, silicon carbide, and diamond.

9. The integrated circuit device of claim 8, wherein the lower plate is formed of a material selected from the group consisting of silicon, silicon carbide, and diamond.

10. The integrated circuit device of claim 1,
wherein the lower plate is formed of a material having a coefficient of thermal expansion close to that of the semiconductor device, the material being selected from the group consisting of glass, Pyrex, and ceramic, and
the upper plate is formed of a metallic alloy or composite with a high thermal conductivity or a material selected from the group consisting of silicon, silicon carbide, and diamond.

11. The integrated circuit device of claim 1, wherein the grooves on the bottom surface of the upper plate and the grooves on the top surface of the lower plate comprise a plurality of walls that do not all have the same height.

12. The integrated circuit device of claim 1,
wherein the grooves on the bottom surface of the upper plate and the grooves on the top surface of the lower plate comprise a plurality of channels, and
an area of the channels on the bottom surface of the upper plate is greater than an area of the channels on the top surface of the lower plate.

13. An integrated circuit device comprising:
a semiconductor device having a front surface containing active devices and a back surface that does not contain active devices, the semiconductor device being made of a material having a coefficient of thermal expansion;
an upper plate having a bottom surface with a plurality of grooves and a top surface, the upper plate being made of a material having high thermal conductivity; and
a lower plate having a top surface with a plurality of grooves and a bottom surface, the lower plate being made of a material having a coefficient of thermal expansion that is substantially the same as the coefficient of thermal expansion of the material of which the semiconductor device is made,
wherein the bottom surface of the upper plate is hermetically bonded to the top surface of the lower plate,
multiple openings arranged in an array extend through the lower plate, and
the back surface of the semiconductor device is hermetically bonded to the bottom surface of the lower plate so as to completely cover all of the openings in the lower plate, so that a vapor chamber is formed by the semiconductor device and the upper and lower plates.

14. The integrated circuit device of claim 13, wherein the openings through the lower plate are spaced about 300 microns or less apart.

15. The integrated circuit device of claim 13, wherein each of the openings through the lower plate has a corrugated edge forming vertical slots around the perimeter of the opening to act as a vertical wick structure for transporting condensed working fluid from the top surface of the lower plate directly to the back surface of the semiconductor device.

16. The integrated circuit device of claim 15, wherein the vertical slots have a dovetail shape.

17. The integrated circuit device of claim 13,
wherein the upper plate is formed of a material selected from the group consisting of silicon, silicon carbide, and diamond, and
the lower plate is formed of a material selected from the group consisting of silicon, silicon carbide, and diamond.

18. The integrated circuit device of claim 13,
wherein a continuous wick structure is formed between the bottom surface of the top plate and the back surface of the semiconductor device through channels on the upper and lower plates and vertical slots.

19. An integrated circuit device comprising:
a semiconductor device having a front surface containing active devices and a back surface that does not contain active devices, the semiconductor device being made of a material having a coefficient of thermal expansion; and
a plate having a bottom surface with a plurality of grooves, the plate being made of a material having high thermal conductivity and a coefficient of thermal expansion that is substantially the same as the coefficient of thermal expansion of the material of which the semiconductor device is made,
wherein the back surface of the semiconductor device is hermetically bonded to the bottom surface of the plate so as to completely cover the grooves, so that a vapor chamber is formed by the semiconductor device and the plate, and
the grooves on the bottom surface of the plate comprise a plurality of walls that extend to within less than 250 microns from the back surface of the semiconductor device.

20. The integrated circuit device of claim 19, wherein the walls of the grooves are bonded to the back surface of the semiconductor device.

21. The integrated circuit device of claim 19, wherein at least some of the walls of the grooves have a corrugated edge forming vertical slots to act as a vertical wick structure for transporting condensed working fluid directly to the back surface of the semiconductor device.

22. The integrated circuit device of claim 21, wherein the vertical slots have interior angles of less than ninety degrees.

23. The integrated circuit device of claim 19, wherein the plate is formed of a material selected from the group consisting of silicon, silicon carbide, and diamond.

24. The integrated circuit device of claim 19, wherein the grooves on the bottom surface of the plate comprise a plurality of walls that do not all have the same height.

25. An integrated circuit device comprising:
a semiconductor device having a front surface containing active devices and a back surface that does not contain active devices, the semiconductor device being made of a material having a coefficient of thermal expansion;
an upper plate having a bottom surface with a recess, the upper plate being made of a material having high thermal conductivity; and
a lower plate having a top surface with a recess and a bottom surface, the lower plate being made of a material having a coefficient of thermal expansion that is substantially the same as the coefficient of thermal expansion of the material of which the semiconductor device is made,
wherein the bottom surface of the upper plate is hermetically bonded to the top surface of the lower plate, at least one opening extends through the lower plate within the recess in the lower plate, the back surface of the semiconductor device is hermetically bonded to the bottom surface of the lower plate so as to completely cover the at least one opening in the lower plate, so that a vapor chamber is formed by the semiconductor device and the upper and lower plates, at least a top surface of the recess in the upper plate and at least a bottom surface of the recess in the lower plate are lined with graphite foam, and a plurality of graphite foam pillars extend from the graphite foam lining the top surface of the recess in the upper plate to the back surface of the semiconductor device, to act as a vertical wick structure for transporting condensed working fluid directly to the back surface of the semiconductor device.

26. The integrated circuit device of claim 25, wherein the plurality of graphite foam pillars are formed by a graphite foam block that is penetrated by vertical channels that extend through the graphite foam block to the back surface of the semiconductor device.

27. The integrated circuit device of claim 26, wherein the graphite foam block is bonded to the back surface of the semiconductor device.

28. The integrated circuit device of claim 26, wherein the vertical channels in the graphite foam block are interconnected by horizontal channels.

29. The integrated circuit device of claim 25, wherein a plurality of microgrooves are provided on at least one wall of the vapor chamber.

30. The integrated circuit device of claim 25, wherein the upper plate is formed of a material selected from the group consisting of silicon, silicon carbide, and diamond, and the lower plate is formed of a material selected from the group consisting of silicon, silicon carbide, and diamond.

* * * * *